United States Patent
Mochizuki

(10) Patent No.: US 7,418,014 B2
(45) Date of Patent: Aug. 26, 2008

(54) SURFACE-EMITTING TYPE SEMICONDUCTOR LASER, AND METHOD FOR MANUFACTURING THE SAME, OPTICAL SWITCH, AND OPTICAL BRANCHING RATIO VARIABLE ELEMENT

(75) Inventor: Masamitsu Mochizuki, Chino (JP)

(73) Assignee: Seiko Epson Corporation (JP)

( * ) Notice: Subject to any disclaimer, the term of this patent is extended or adjusted under 35 U.S.C. 154(b) by 216 days.

(21) Appl. No.: 11/128,854

(22) Filed: May 13, 2005

(65) Prior Publication Data
US 2005/0265414 A1    Dec. 1, 2005

(30) Foreign Application Priority Data
May 28, 2004    (JP) .............................. 2004-159410

(51) Int. Cl.
*H01S 3/098* (2006.01)
(52) U.S. Cl. ...................... 372/19; 372/28; 372/46.013; 372/46.015; 372/96
(58) Field of Classification Search .................. 372/19, 372/28, 46.013, 46.015, 96
See application file for complete search history.

(56) References Cited
U.S. PATENT DOCUMENTS

| 5,052,008 | A | | 9/1991 | Kemeny |
| 5,101,293 | A | | 3/1992 | Kemeny |
| 6,061,485 | A | * | 5/2000 | Jiang et al. ..................... 385/28 |
| 6,339,496 | B1 | * | 1/2002 | Koley et al. .................. 359/344 |
| 6,594,296 | B1 | * | 7/2003 | Kaneko .................... 372/46.01 |
| 6,798,810 | B2 | * | 9/2004 | Albrecht .................. 372/45.01 |
| 7,126,977 | B2 | * | 10/2006 | Kaneko ........................ 372/99 |
| 2002/0172247 | A1 | * | 11/2002 | Sopra et al. .................... 372/46 |
| 2004/0042518 | A1 | * | 3/2004 | Tatum et al. .................. 372/46 |

FOREIGN PATENT DOCUMENTS

JP    3-502747    6/1991

(Continued)

OTHER PUBLICATIONS

Ackemann et al "Spatial mode structure of bottom-emitting broad-area vertical-cavity surface-emitting lasers" J. Opt. B: Quantum Semiclass. Opt. 2 (2000) 406-412 UK.*

*Primary Examiner*—Minsun Harvey
*Assistant Examiner*—Yuanda Zhang
(74) *Attorney, Agent, or Firm*—Harness, Dickey & Pierce, P.L.C.

(57) ABSTRACT

A surface-emitting type semiconductor laser includes a substrate, a first distributed Bragg reflection type mirror formed above the substrate, an active layer formed above the first mirror, a second distributed Bragg reflection type mirror formed above the active layer, and an insulation layer having an opening section that is formed in one of the first and second mirrors, wherein light generated from the active layer is emitted as a lower order mode laser beam lower order modeor a higher order mode laser beamhigher order mode, and the first mirror is formed with a number of pairs greater than the number of pairs of the second mirror such that the lower order mode laser beamlower order mode can be emitted in an upward direction of the substrate, and the opening section in the insulation layer is formed to have a size that enables the higher order mode laser beamhigher order mode to be emitted in a downward direction of the substrate.

3 Claims, 9 Drawing Sheets

FOREIGN PATENT DOCUMENTS

| | | |
|---|---|---|
| JP | 05-235473 | 9/1993 |
| JP | 06-051354 | 2/1994 |
| JP | 08-088441 | 4/1996 |
| JP | 09-199795 | 7/1997 |
| JP | 2001-274505 | 10/2001 |

* cited by examiner

SURFACE-EMITTING TYPE SEMICONDUCTOR LASER, AND METHOD FOR MANUFACTURING THE SAME, OPTICAL SWITCH, AND OPTICAL BRANCHING RATIO VARIABLE ELEMENT

RELATED APPLICATIONS

This application claims priority to Japanese Patent Application No. 2004-159410 filed May 28, 2004 which is hereby expressly incorporated by reference herein in its entirety.

BACKGROUND

1. Technical Field

The present invention relates to surface-emitting type semiconductor lasers and methods for manufacturing the same, optical switches and optical branching ratio variable elements.

2. Related Art

Surface-emitting type semiconductor lasers are semiconductor lasers which emit laser light in a direction perpendicular to a semiconductor substrate, easy to handle compared to conventional edge emitting semiconductor lasers, and have a circular irradiation pattern, such that application thereof to a variety of sensors and light sources for optical communications are expected. Further, surface-emitting type semiconductor lasers that are used as light sources for optical communications are expected to be used not only for intermediate and short distance optical communications but also as optical circuit elements for chip-to-chip and inner-chip communications.

Also, interference type switches that use directional couplers in a planar direction and the like are widely used in the field of optical circuits (i.e., PLC: planar lightwave circuit) (see, for example, Japanese Laid-open Patent Application HEI 6-51354). However, it is difficult to form directional couplers in an up-and-down direction (a direction perpendicular to a planar direction).

It is an object of the present invention to provide a surface-emitting type semiconductor laser that can change the ratio of outputs of laser beams emitted in upward and downward directions of a substrate, and a method for manufacturing the same. Also, it is another object of the present invention is to provide an optical switch that uses the surface-emitting type semiconductor laser described above. Also, it is still another object of the present invention to provide an optical branching ratio variable element that can change the ratio of outputs of laser beams emitted in upward and downward directions of a substrate.

SUMMARY

A surface-emitting type semiconductor laser in accordance with the present invention includes:
a substrate;
a first distributed Bragg reflection type mirror formed above the substrate;
an active layer formed above the first distributed Bragg reflection type mirror;
a second distributed Bragg reflection type mirror formed above the active layer; and
an insulation layer having an opening section, which is formed in one of the first distributed Bragg reflection type mirror and the second distributed Bragg reflection type mirror, wherein
light generated from the active layer is emitted as a laser beam of a lower order mode or a laser beam of a higher order mode,
the first distributed Bragg reflection type mirror is formed with a number of pairs greater than a number of pairs of the second distributed Bragg reflection type mirror such that the laser beam of the lower order mode can be emitted in an upward direction of the substrate, and
the opening section in the insulation layer is formed to have a size that enables the laser beam of the higher order mode to be emitted in a downward direction of the substrate.

In the present invention, a specific object (hereafter referred to as "B") above another specific object (hereafter referred to as "A") includes B that is formed directly on A, and B that is formed over A through another object on A.

According to the surface-emitting type semiconductor laser, the laser beam of the lower order mode can be emitted in the upward direction of the substrate, and the laser beam of the higher order mode can be emitted in the downward direction of the substrate.

A surface-emitting type semiconductor laser in accordance with the present invention includes:
a substrate;
a first distributed Bragg reflection type mirror formed above the substrate;
an active layer formed above the first distributed Bragg reflection type mirror;
a second distributed Bragg reflection type mirror formed above the active layer; and
an insulation layer having an opening section, which is formed in one of the first distributed Bragg reflection type mirror and the second distributed Bragg reflection type mirror, wherein
light generated from the active layer is emitted as a laser beam of a lower order mode or a laser beam of a higher order mode,
the first distributed Bragg reflection type mirror is formed with a number of pairs greater than a number of pairs of the second distributed Bragg reflection type mirror such that the laser beam of the lower order mode can be emitted in an upward direction of the substrate, and
the opening section in the insulation layer is formed to have a size that enables the laser beam of the higher order mode to be totally reflected at an upper surface of the second distributed Bragg reflection type mirror.

In the surface-emitting type semiconductor laser in accordance with the present invention, at least the second distributed Bragg reflection type mirror may define a columnar section, and an outer diameter of the columnar section may be formed such that an output of the laser beam of the higher order mode emitted in the downward direction of the substrate is greater than an output of the laser beam of the higher order mode emitted in the upward direction of the substrate.

According to the surface-emitting type semiconductor laser, the output of the laser beam of the higher order mode emitted in the downward direction of the substrate can be made greater than the output of the laser beam of the higher order mode emitted in the upward direction of the substrate.

In the surface-emitting type semiconductor laser in accordance with the present invention, a side surface of the columnar section may be inclined such that the output of the laser beam of the higher order mode emitted in the downward direction of the substrate is greater than the output of the laser beam of the higher order mode emitted in the upward direction of the substrate.

In the surface-emitting type semiconductor laser in accordance with the present invention, in the relation between an output proportion in the upward direction of the substrate and an output proportion in the downward direction of the substrate in the laser beam of the higher order mode with respect to the outer diameter of the columnar section, a first line indicative of a proportion of the laser beam emitted in the upward direction of the substrate intersects a second line indicative of a proportion of the laser beam emitted in the downward direction of the substrate, and the outer diameter of the columnar section may be smaller than an outer diameter of the columnar section at which the first line and the second line intersect each other.

In the present invention, the output proportion in the upward direction is a proportion of the output in the upward direction with respect the sum of the output of the laser beam in the upward direction of the substrate, the output in the downward direction and losses in the output from the side surface. Similarly, the output proportion in the downward direction is a proportion of the output in the downward direction with respect the sum of the output of the laser beam in the upward direction of the substrate, the output in the downward direction and losses in the output from the side surface. Accordingly, there are cases where addition of the output proportion in the upward direction and the output proportion in the downward direction makes generally 1, and where addition thereof does not make 1 due to the losses.

In the surface-emitting type semiconductor laser in accordance with the present invention, in the relation between an output proportion in the upward direction of the substrate and an output proportion in the downward direction of the substrate in the laser beam of the higher order mode with respect to the outer diameter of the columnar section, a first line indicative of an output proportion of the laser beam emitted in the upward direction of the substrate intersects a second line indicative of an output proportion of the laser beam emitted in the downward direction of the substrate, and the outer diameter of the columnar section may be smaller than an outer diameter of the columnar section at which the first line and the second line intersect each other.

In the surface-emitting type semiconductor laser in accordance with the present invention, in the relation between an output proportion in the upward direction of the substrate and an output proportion in the downward direction of the substrate in the laser beam of the higher order mode with respect to the outer diameter of the columnar section, a first line indicative of the relation in the laser beam emitted in the upward direction of the substrate intersects a second line indicative of the relation in the laser beam emitted in the downward direction of the substrate, and the outer diameter of the columnar section may be smaller than an outer diameter of the columnar section at which the first line and the second line intersect each other.

In the surface-emitting type semiconductor laser in accordance with the present invention, a ratio of the sum of the output of the laser beam of the lower order mode and the output of the laser beam of the higher order mode which are emitted in the downward direction of the substrate to the sum of the output of the laser beam of the lower order mode and the output of the laser beam of the higher order mode which are emitted in the upward direction of the substrate may change according to an excitation state by at least one of current and light.

According to the above surface-emitting type semiconductor laser, the output ratio of laser beams emitted in the upward and downward directions of the substrate can be changed by changing the excitation state of at least one of current and light.

In the surface-emitting type semiconductor laser in accordance with the present invention, when at least one of a current amount of the current and a light amount of the light increases, the sum of the output of the laser beam of the lower order mode and the output of the laser beam of the higher order mode which are emitted in the upward direction of the substrate may decrease, and the sum of the output of the laser beam of the lower order mode and the output of the laser beam of the higher order mode which are emitted in the downward direction of the substrate may increase.

An optical switch in accordance with the present invention can use the surface-emitting type semiconductor laser described above.

An optical branching ratio variable element in accordance with the present invention includes:

a substrate;

a first distributed Bragg reflection type mirror formed above the substrate;

an incident layer formed above the first distributed Bragg reflection type mirror;

a second distributed Bragg reflection type mirror formed above the incident layer; and an insulation layer having an opening section, which is formed in one of the first distributed Bragg reflection type mirror and the second distributed Bragg reflection type mirror, wherein light incident upon the incident layer is emitted as a laser beam of a lower order mode or a laser beam of a higher order mode, the first distributed Bragg reflection type mirror is formed with a number of pairs greater than a number of pairs of the second distributed Bragg reflection type mirror such that the laser beam of the lower order mode can be emitted in an upward direction of the substrate, and the opening section in the insulation layer is formed to have a size that enables the laser beam of the higher order mode to be emitted in a downward direction of the substrate.

An optical branching ratio variable element in accordance with the present invention includes:

a substrate;

a first distributed Bragg reflection type mirror formed above the substrate;

an incident layer formed above the first distributed Bragg reflection type mirror;

a second distributed Bragg reflection type mirror formed above the incident layer; and an insulation layer having an opening section, which is formed in one of the first distributed Bragg reflection type mirror and the second distributed Bragg reflection type mirror, wherein light incident upon the incident layer is emitted as a laser beam of a lower order mode or a laser beam of a higher order mode, and the opening section in the insulation layer is formed to have a size that enables the laser beam of the higher order mode to be totally reflected at an upper surface of the second distributed Bragg reflection type mirror.

In the optical branching ratio variable element in accordance with the present invention, at least the second distributed Bragg reflection type mirror defines a columnar section, and an outer diameter of the columnar section may be formed such that an output of the laser beam of the higher order mode emitted in the downward direction of the substrate is greater than an output of the laser beam of the higher order mode emitted in the upward direction of the substrate.

A method for manufacturing a surface-emitting type semiconductor laser in accordance with the present invention includes:

a step of laminating semiconductor layers for forming at least, above a substrate, a first distributed Bragg reflection type mirror, an active layer, and a second distributed Bragg reflection type mirror;

a first etching step of etching layers for forming at least the second distributed Bragg reflection type mirror among the semiconductor layers to form a columnar section;

a step of oxidizing a layer in the columnar section from a side surface thereof to form an insulation layer having an opening section; and a second etching step of etching the columnar section to reduce an outer diameter of the columnar section.

In the method for manufacturing a surface-emitting type semiconductor laser in accordance with the present invention, the outer diameter of the columnar section and the size of the opening section of the insulation layer may be formed such that light generated from the active layer is emitted as a laser beam of a lower order mode or a laser beam of a higher order mode, and the outer diameter of the columnar section formed by the first etching step may be formed such that an output of the laser beam of the higher order mode emitted in an upward direction of the substrate is greater than an output of the laser beam of the higher order mode emitted in a downward direction of the substrate.

In the method for manufacturing a surface-emitting type semiconductor laser in accordance with the present invention, the outer diameter of the columnar section formed by the second etching step may be formed such that the output of the laser beam of the higher order mode emitted in the downward direction of the substrate is greater than the output of the laser beam of the higher order mode emitted in the upward direction of the substrate.

A method for manufacturing a surface-emitting type semiconductor laser in accordance with the present invention includes:

a step of laminating semiconductor layers for forming at least, above a substrate, a first distributed Bragg reflection type mirror, an active layer, and a second distributed Bragg reflection type mirror;

a step of forming a columnar section by etching layers for forming at least the second distributed Bragg reflection type mirror among the semiconductor layers; and a step of oxidizing a layer in the columnar section from a side surface thereof to form an insulation layer having an opening section, wherein an outer diameter of the columnar section and a size of the opening section of the insulation layer are formed such that light generated from the active layer is emitted as a laser beam of a lower order mode or a laser beam of a higher order mode, the first distributed Bragg reflection type mirror is formed with a number of pairs greater than a number of pairs of the second distributed Bragg reflection type mirror such that the laser beam of the lower order mode can be emitted in an upward direction of the substrate, and the size of the opening section in the insulation layer is formed such that the laser beam of the higher order mode can be emitted in a downward direction of the substrate.

In the method for manufacturing a surface-emitting type semiconductor laser in accordance with the present invention, the outer diameter of the columnar section may be formed such that the output of the laser beam of the higher order mode emitted in the downward direction of the substrate is greater than the output of the laser beam of the higher order mode emitted in the upward direction of the substrate.

BRIEF DESCRIPTION OF THE DRAWINGS

FIG. 8 is a graph in which FIG. 7 is superposed, for convenience' sake, with a diagram indicating a relation H of the angular frequency ω with respect to the wavenumber components $k_z$.

FIG. 10 is a graph in which FIG. 9 is superposed, for convenience' sake, with a diagram indicating a relation H of the angular frequency (o with respect to the wavenumber components $k_{xy}$.

DETAILED DESCRIPTION

Preferred embodiments of the present invention are described below with reference to the accompanying drawings.

1. Device Structure

Figure 1:
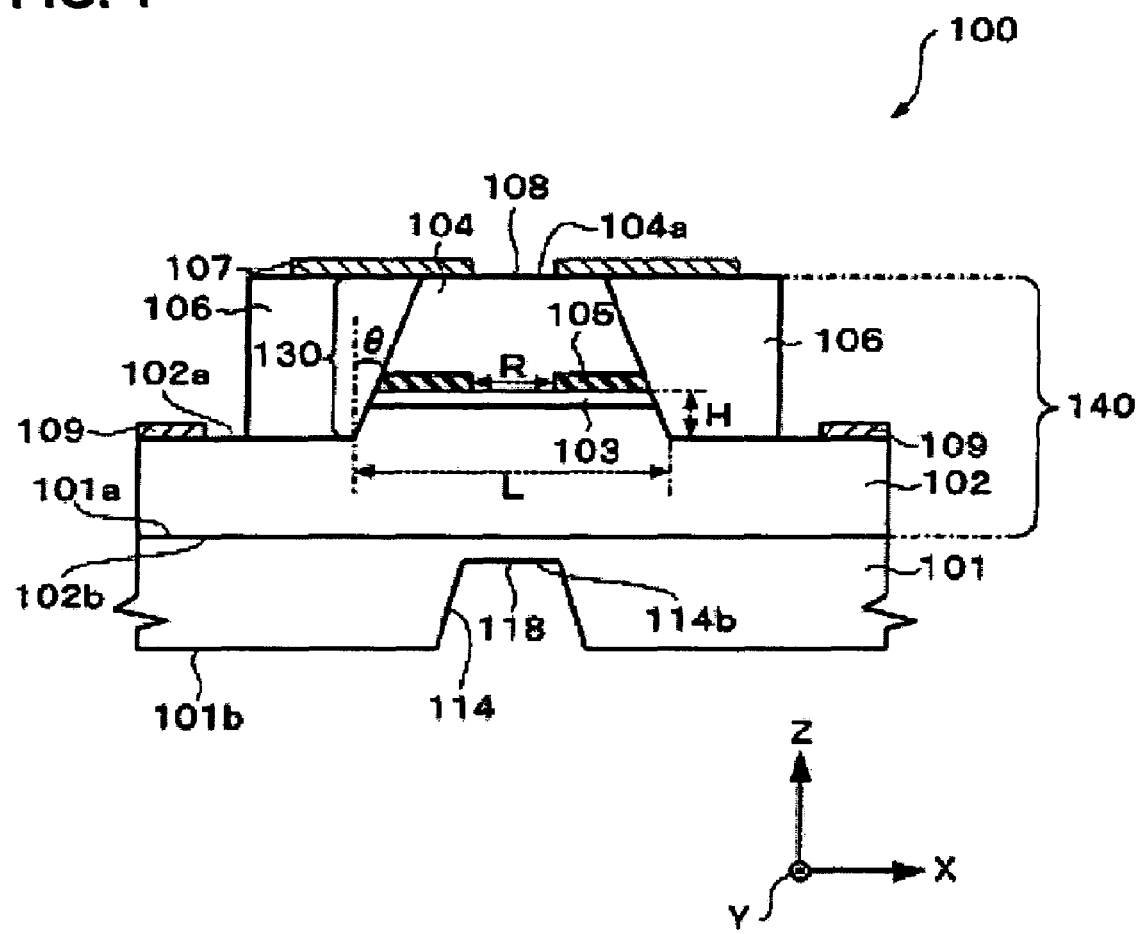
FIG. 1 is a cross-sectional view schematically showing a surface-emitting laser in accordance with an embodiment.
Figure 2:
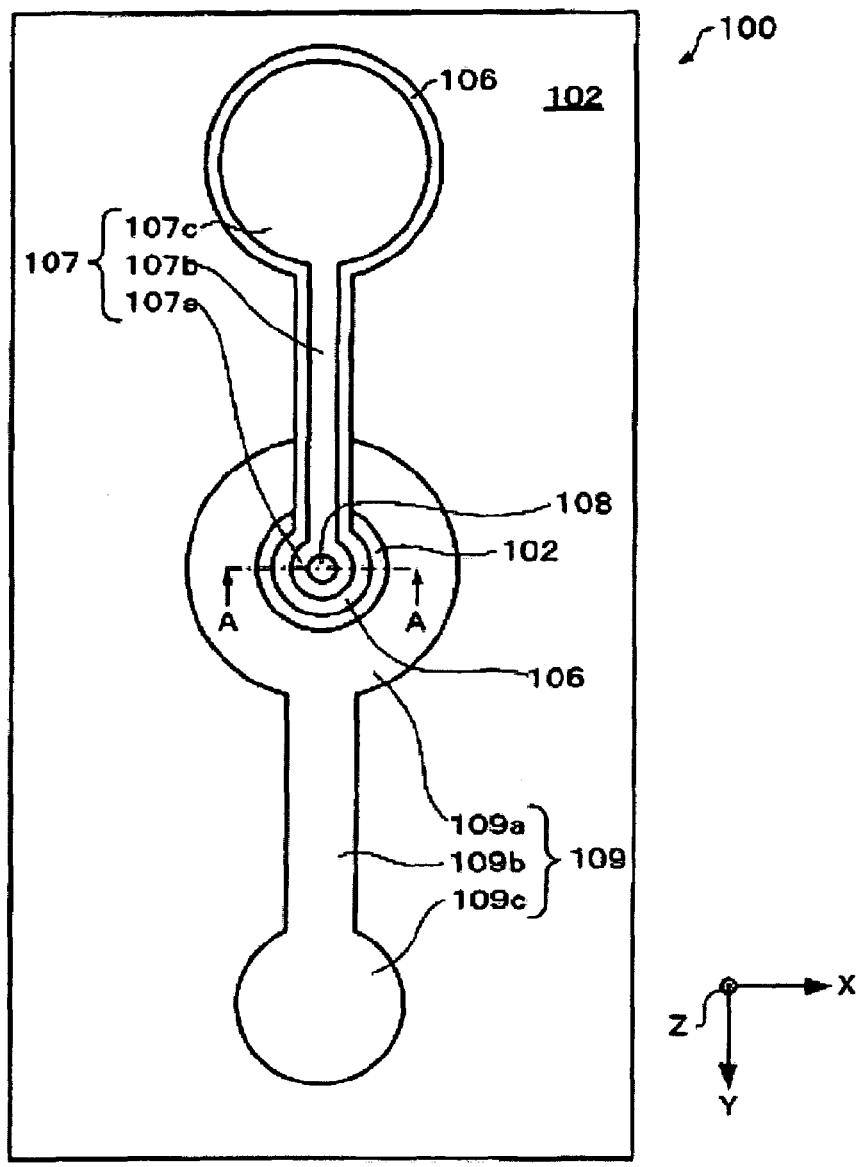
FIG. 2 is a plan view schematically showing the surface-emitting laser in accordance with the embodiment.

FIG. 1 is a cross-sectional view schematically showing an optical element 100 in accordance with the present invention, and FIG. 2 is a plan view schematically showing the optical element 100 shown in FIG. 1. FIG. 1 is a cross-sectional view taken along a line A-A of FIG. 2. First, an example in which the optical element 100 is a surface-emitting type semiconductor laser is described. It is noted that the optical element 100 is referred hereunder to as a surface-emitting type semiconductor laser (hereinafter also referred to as a "surface emitting laser") 100.

As shown in FIG. 1 and FIG. 2, the surface-emitting laser 100 in accordance with an embodiment of the present invention includes a substrate (a GaAs substrate in the present embodiment) 101, a vertical resonator (hereafter referred to as a "resonator") 140 formed on the substrate 101, a first electrode 107, and a second electrode 109.

Next, components of the surface-emitting laser 100 are described below.

The resonator 140 includes a first distributed Bragg reflection type mirror (hereafter also referred to as a "first mirror") 102 composed of a semiconductor multilayer film, an active layer 103, a second distributed Bragg reflection type mirror (hereafter also referred to as a "first mirror") 104 composed of a semiconductor multilayer film, and an insulation layer 105.

It may not be a problem as a "vertical resonator" is simply referred to as a "resonator," as described in the previous paragraph. But, the optical containment (resonation) in the transverse direction is determined by the oxidation diameter. Cases of simply referring to as a "resonator" may preferably be added.

Light generated from the active layer 103 is emitted as a laser beam of a lower order mode or a laser beam of a higher order mode from a first emission surface 108 or a second emission surface 118. The number of order of the laser beam of the lower order mode is smaller than the number of order of the laser beam of the higher order mode. Concretely, for example, the laser beam of the lower order mode can be a laser beam of the basic mode (the $0^{th}$ order mode; LP01 mode when the columnar section 130 is in a cylindrical shape), and the laser beam of the higher order mode can be a laser beam of the first order mode (LP11 mode when the columnar section 130 is in a cylindrical shape). Also, for example, the laser beam of the lower order mode can be a laser beam of the first order mode, and the laser beam of the higher order mode can be a laser beam of the second order mode. Also, for example, the laser beam of the lower order mode can be a laser beam of the basic mode, and the laser beam of the higher order mode can be a laser beam of the second order mode. It is noted that the number of order of the laser beam of the lower order mode or the laser beam of the higher order mode is not limited to those described above.

The first mirror 102 is formed with a number of pairs greater than a number of pairs of the second mirror 104 such that the laser beam of the lower order mode can be emitted in an upward direction (+Z direction in FIG. 1) of the substrate 101. Concretely, the resonator 140 includes, for example, the first mirror 102 that is a distributed Bragg reflection type mirror (DBR) of 37.5 pairs of alternately laminated n-type $Al_{0.9}Ga_{0.1}As$ layer and n-type $Al_{0.15}Ga_{0.85}As$ layer, the active layer 103 composed of GaAs well layers and $Al_{0.3}Ga_{0.7}As$ barrier layers in which the well layers include a quantum well structure composed of three layers, and the second mirror 104 that is a distributed Bragg reflection type mirror (DBR) of a semiconductor multilayer film of 25 pairs of alternately laminated p-type $Al_{0.9}Ga_{0.1}As$ layer and p-type $Al_{0.15}Ga_{0.85}As$ layer. It is noted that the composition of each of the layers and the number of the layers forming the first mirror 102, the active layer 103 and the second mirror 104 are not limited to the above.

The second mirror 104 is made to be p-type, for example, by doping C, Zn or Mg, and the first mirror 102 is made to be n-type, for example, by doping Si or Se. Accordingly, the second mirror 104, the active layer 103 in which no impurity is doped and the first mirror 102 form a pin diode.

The second mirror 104, the active layer 103 and a part of the first mirror 102 composes a semiconductor deposited body in a pillar shape (hereafter referred to as a "columnar section") 130. The side surface of the columnar section 130 may preferably be covered with an embedding insulation layer 106. A resin that composes the embedding insulation layer 106 may preferably be polyimide resin, fluororesin, acrylic resin, or epoxy resin, and more particularly, it may preferably be polyimide resin or fluororesin in view of their good workability and insulation property.

An insulation layer 105 having an opening section is formed in the second mirror 104. The insulation layer 105 can have a ring shape along the circumference of the columnar section 130. The insulation layer 105 may be composed of aluminum oxide, for example.

The diameter R of the opening section of the insulation layer 105 is formed such that the laser beam of the higher order mode can be emitted in a downward direction (−Z direction in FIG. 1) of the substrate 101. Details thereof are described below in the section "1-2. Operation of Device."

The outer diameter L of the columnar section 130 is formed such that the output of the laser beam of the higher order mode emitted in the downward direction (−Z direction in FIG. 1) of the substrate 101 is greater than the output of the laser beam of the higher order mode emitted in the upward direction (+Z direction in FIG. 1) of the substrate 101. Details thereof are described below in the section "1-2. Operation of Device." It is noted that the outer diameter L of the columnar section 130 is an outer diameter of the columnar section 130 at its lowermost end, as shown in FIG. 1.

The side surface of the columnar section 130 is inclined such that the output of the laser beam of the higher order mode emitted in the downward direction of the substrate 101 can be greater than the output of the laser beam of the higher order mode emitted in the upward direction of the substrate 101. Details thereof are described below in the section "1-2. Operation of Device." As shown in FIG. 1, the side surface of the columnar section 130 is inclined at an angle θ with respect to the vertical upward direction (+Z direction) of the substrate 101. The angle θ is, for example, 7-8°.

The first electrode 107 is formed on the columnar section 130 and the embedding insulation layer 106. As shown in FIG. 2, the first electrode 107 has a connection section 107a having a plane configuration of a ring shape, a lead-out section 107b having a plane configuration of a linear shape, and a pad section 107c having a circular plane configuration. The first electrode 107 is electrically connected to the second mirror 104 at the connection section 107a. The lead-out section 107b of the first electrode 107 connects the connection section 107a and the pad section 107c. The pad section 107c of the first electrode 107 can be used as an electrode pad. An opening section of the first electrode 107 over the columnar section 130 defines a first emission surface 108 of the laser beam. The first electrode 107 may be composed of a laminated film of, for example, Au and an alloy of Au and Zn.

Further, the second electrode 109 is formed on the first mirror 102. As shown in FIG. 2, the second electrode 109 has a connection section 109a having a plane configuration of a ring shape, a lead-out section 109b having a plane configuration of a linear shape, and a pad section 109c having a circular plane configuration. The second electrode 109 is electrically connected to the first mirror 102 at the connection section 109a. The lead-out section 109b of the second electrode 109 connects the connection section 109a and the pad section 109c. The pad section 109c of the second electrode 109 can be used as an electrode pad. The connection section 109a of the second electrode 109 is provided in a manner to surround mainly the embedding insulation layer 106. In other words, the embedding insulation layer 106 is provided inside the second electrode 109. The second electrode 109 may be composed of a laminated film of, for example, Au and an alloy of Au and Ge.

In the surface-emitting laser 100 shown in FIG. 1 and FIG. 2, the first electrode 107 connects to the second mirror 104, and the second electrode 109 connects to the first mirror 102. A current is injected in the active layer 103 by the first electrode 107 and the second electrode 109.

It is noted that, although the present embodiment indicates a case where the second electrode 109 is provided on the first mirror 102, the second electrode 109 can be provided on a back surface 101b of the substrate 101.

It is noted that the materials for forming the first electrode 107 and the second electrode 109 are not limited to those described above, but other metals, such as, for example, Cr, Ti, Ni, Au and Pt, and an alloy of these metals can be used according to the requirements for adhesion enhancement, diffusion prevention and/or oxidation prevention.

An opening section 114 that penetrates the substrate 101 may be formed in the substrate 101. In this case, a bottom surface 114b of the opening section 114 defines a second emission surface 118 of the laser beam.

1-2 Operation of Device

Operations of the surface-emitting laser 100 of the present embodiment are described below. It is noted that the following method for driving the surface-emitting laser 100 is described as an example, and various changes can be made without departing from the subject matter of the present invention.

First, when a voltage in a forward direction is applied to the pin diode by the first electrode 107 and the second electrode 109, recombination of electrons and holes occur in the active layer 103, thereby causing emission of light due to the recombination. Stimulated emission occurs during the period in which the generated light reciprocates between the second mirror 104 and the first mirror 102, whereby the light intensity is amplified. When the optical gain exceeds the optical loss, laser oscillation occurs, whereby laser beams are emitted in upward and downward directions perpendicular to the substrate 101 from the first emission surface 108 that is present on the upper surface 104a of the second mirror 104 and from the second emission surface 118 that is present on the back surface 101b of the substrate 101, respectively. Details thereof are described below.

In general, light that propagates in dielectric body or free space satisfies the following formula:

$$\omega = c k_0 = (c/n) \cdot n k_0 = c k/n \quad \text{Formula (1)}$$

Here, ω is an angular frequency, c is a speed of light in free space, n is a refractive index of a medium, $k_0$ is a wavenumber of free space, and k is a wavenumber in the medium. Because $k = n k_0$, the wavenumber k in the medium becomes greater in proportion to the refractive index n.

Figure 3:
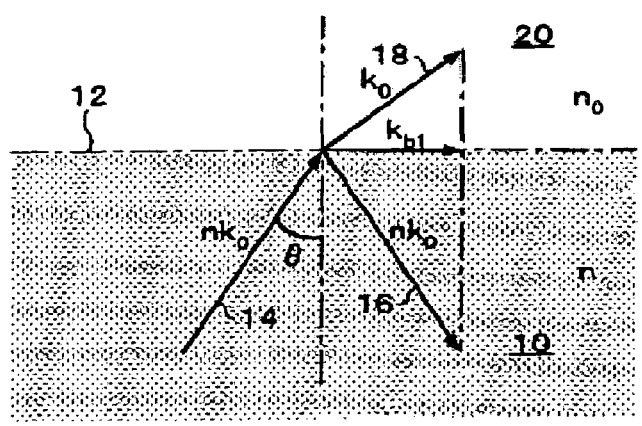
FIG. 3 is a diagram schematically showing the behavior of light at a boundary between a medium having a refractive index n and free space.
Figure 4:
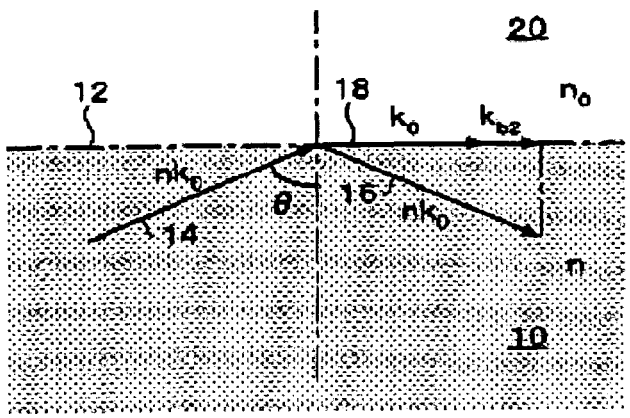
FIG. 4 is a diagram schematically showing the behavior of light at a boundary between a medium having a refractive index n and free space.

FIG. 3 and FIG. 4 are diagrams schematically showing the behavior of light at a boundary 12 between the medium 10 of a refractive index n and the free space 20. $n_0$ is a refractive index of the free space 20. FIG. 3 and FIG. 4 indicate an example in which light hits the boundary 12 from medium 10. In other words, incident light 14 changes to reflected light 16 that is reflected at the boundary 12, and refracted light 18 that is refracted at the boundary 12. Also, the incident light 14 is incident upon the boundary 12 at an incident angle θ. As shown in FIG. 3, when light is incident upon a medium of a low refractive index (free space) from a medium of a high refractive index (the medium 10), and when the incident angle θ is relatively small, wavenumber components in a boundary direction of the boundary 12 have continuity. In other words, as shown in FIG. 3, a wavenumber component in the boundary direction of the reflected light 16 and a wavenumber component in the boundary direction of the refracted light 18 become the same $k_{b1}$.

On the other hand, as shown in FIG. 4, when the incident angle θ is relatively large, wavenumber components in the boundary direction of the boundary 12 do not have continuity. In other words, a wavenumber component in the boundary direction of the reflected light 16 and a wavenumber component in the boundary direction of the refracted light 18 cannot take the same value. Concretely, a wavenumber component $k_{b2}$ in the boundary direction of the reflected light 16 is greater than a maximum possible size of the wavenumber component of $k_0$ in the boundary direction of the refracted light 18. This is a so-called total reflection condition. This is expressed by the following formula:

$$k_0 < k_{b2} \quad \text{Formula (2)}$$

$$k_0 < n k_0 \sin \theta$$

Figure 5:
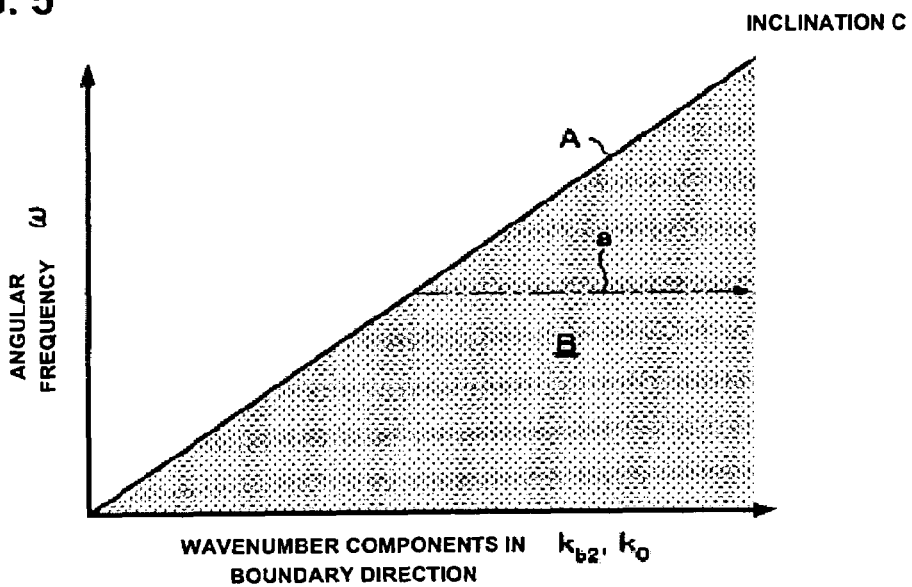
FIG. 5 is a diagram indicating the total reflection condition at a boundary between a medium having a refractive index n and free space.

The total reflection condition is illustrated based on the above formula (1) and formula (2) as shown in FIG. 5

A linear line A illustrates $\omega = c k_0$

Accordingly, the linear line A has an inclination, which is c. $k_{b2}$ that is greater than $k_0$ in the linear line A, in other words, $k_{b2}$ that satisfies the condition of the formula (2), has a value within a region B shown in FIG. 5. In other words, when $k_{b2}$ has a value within the region B on the right side of the linear line A (on the side indicated by an arrow a in FIG. 5), the total reflection condition is met.

Figure 6:
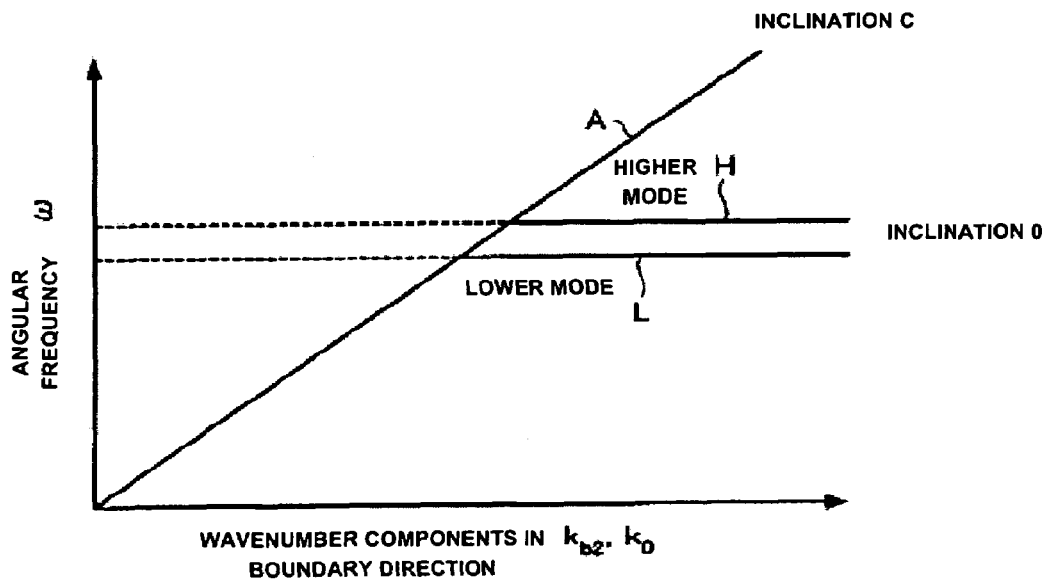
FIG. 6 is a diagram indicating the total reflection condition in the case of oscillation modes of a surface-emitting laser in accordance with an embodiment.

FIG. 6 illustrates the total reflection condition in the case of an oscillation mode. In the case of the oscillation mode, light is a standing wave, and its group velocity $\partial\omega/\partial k_{b2}$ is 0. Accordingly, as shown in FIG. 6, the inclination of a linear line L indicating light of a lower order mode and that of a linear line H indicating light of a higher order mode become 0. In other words, various wavenumber components can be provided for one oscillation mode (angular frequency). Further, for one oscillation mode, wavenumber components that totally reflect ($k_0 < k_{b2}$) and wavenumber components that do no totally reflect ($k_0 > k_{b2}$) coexist. The proportion of the coexisting wavenumber components is different depending on each oscillation mode. In FIG. 6, among the linear line L indicating the lower order mode, a portion that has total reflection is indicated by a solid line, and a portion that does not have total reflection is indicated by a dotted line. Also, among the linear line H indicating the higher order mode, a portion that has total reflection is indicated by a solid line, and a portion that does not have total reflection is indicated by a dotted line.

Figure 7:
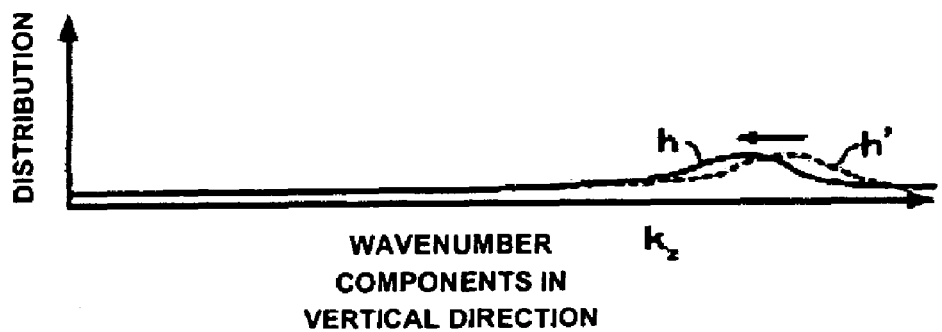
FIG. 7 is a diagram indicating a distribution of wavenumber components $k_z$ in the vertical direction of light of a higher order mode in a resonator.

Next, the case of the surface-emitting laser 100 in accordance with the present embodiment is described. A distribution of wavenumber components $k_z$ of light of a higher order mode in a vertical direction (Z direction indicated in FIG. 1) in the resonator 140 is shown in FIG. 7, for example. By adjusting the diameter R of the opening section of the insulation layer 105, a peak of the distribution of wavenumber components $k_z$ moves, for example, in a direction indicated by an arrow in FIG. 7. It is noted that, in FIG. 7, the distribution h' of wavenumber components $k_z$ before adjusting the diameter R of the opening section of the insulation layer 105 is indicated by a dotted line, and the distribution h of wavenumber components $k_z$ after adjusting the diameter R of the opening section of the insulation layer 105 is indicated by a solid line. The surface-emitting laser 100 in accordance with the present embodiment has in the insulation layer 105 an opening section whose diameter R is adjusted.

Figure 8:
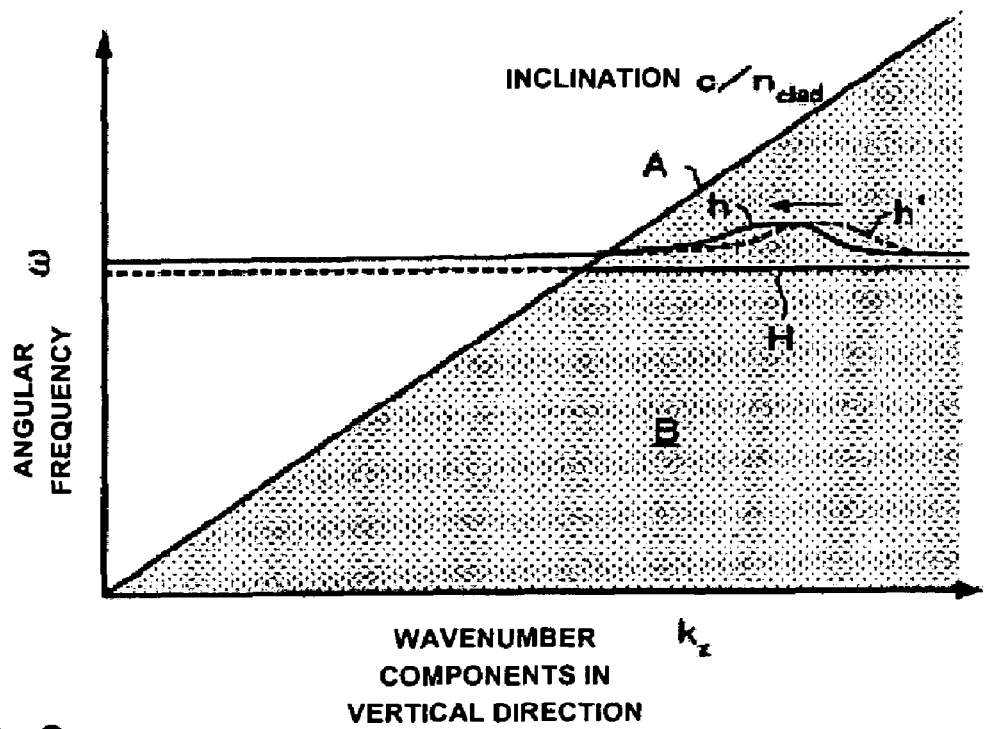

FIG. 8 is a graph in which the distribution of wavenumber components $k_z$ shown in FIG. 7 is superposed, for convenience' sake, with a diagram indicating the relation H of the angular frequency ω with respect to the wavenumber components $k_z$.

The inclination of the linear line A is $c/n_{clad}$.

$n_{clad}$ is an average refractive index of a vertical cross section including the insulation layer 105. It can be approximately expressed as:

$n_{clad} = \sqrt{\epsilon_{clad}}$ $\epsilon_{clad} = \int \epsilon(z) |E(z)|^2 dz / \int |E(z)|^2 dz$ (see, for example, G. Ronald Hadley; OPTICS LETTERS/ Vol. 20, No. 13 (1995) 1483).

The total reflection condition at the boundary between a vertical cross section including the semiconductor layer at the opening section of the insulation layer 105 (hereafter also referred to as a "semiconductor layer vertical cross section") and a vertical cross section including the insulation layer 105 (hereafter also referred to as an "insulation layer vertical cross section") is decided by wavenumber components in the vertical direction (Z direction indicated in FIG. 1). In other words, as described above, the total reflection condition at the boundary between the semiconductor layer vertical cross section and the insulation layer vertical cross section is satisfied, when $k_z$ has a value in the region B on the right side of the linear line A. It is noted here that the vertical cross section is a cross section in parallel with Z direction indicated in FIG. 1.

As shown in FIG. 8, in the surface-emitting laser 100 in accordance with the present embodiment, the opening of the insulation layer 105 has the diameter R such that the peak of the distribution h of wavenumber components $k_z$ in the vertical direction in the light of the higher order mode exists in the region B on the right side of the linear line A. In other words, in the surface-emitting laser 100 in accordance with the present embodiment, the insulation layer 105 has the opening section having the diameter R such that the majority of wavenumber components $k_z$ in the vertical direction in the light of the higher order mode satisfies the total reflection condition. Accordingly, the light of the higher order mode can totally reflect at the boundary between the semiconductor layer vertical cross section and the insulation layer vertical cross section. Thus, in the vertical direction (Z direction indicated in FIG. 1), it can be repeatedly reflected by the first mirror 102 and the second mirror 104 which are distributed Bragg reflection type mirrors. Therefore, the surface-emitting laser 100 in accordance with the present embodiment can oscillate the laser beam of the higher order mode.

Figure 9:
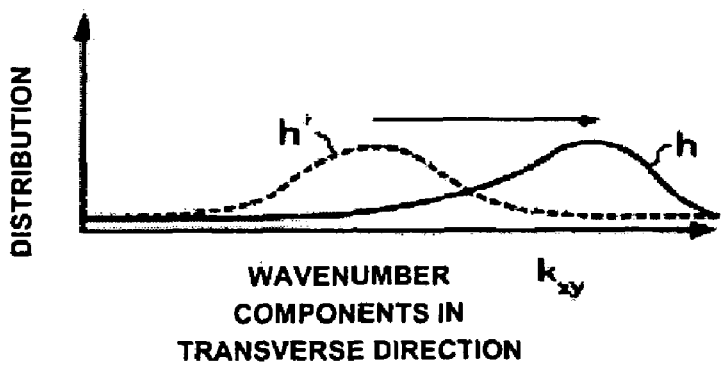
FIG. 9 is a diagram indicating a distribution of wavenumber components $k_{xy}$ in the transverse direction of light of the higher order mode in the resonator.

Also, a distribution of wavenumber components $k_{xy}$ of light of a higher order mode in a transverse direction (a direction in parallel with an x-y plane indicated in FIG. 1) in the resonator 140 is shown in FIG. 9, for example. By adjusting the diameter R of the opening section of the insulation layer 105, a peak of the distribution of wavenumber components $k_{xy}$ moves, for example, in a direction indicated by an arrow in FIG. 9. It is noted that, in FIG. 9, the distribution h' of wavenumber components $k_{xy}$ before adjusting the diameter R of the opening section of the insulation layer 105 is indicated by a dotted line, and the distribution h of wavenumber components $k_{xy}$ after adjusting the diameter R of the opening section of the insulation layer 105 is indicated by a solid line. The surface-emitting laser 100 in accordance with the present embodiment has an opening section in the insulation layer 105 whose diameter R is adjusted.

Figure 10:
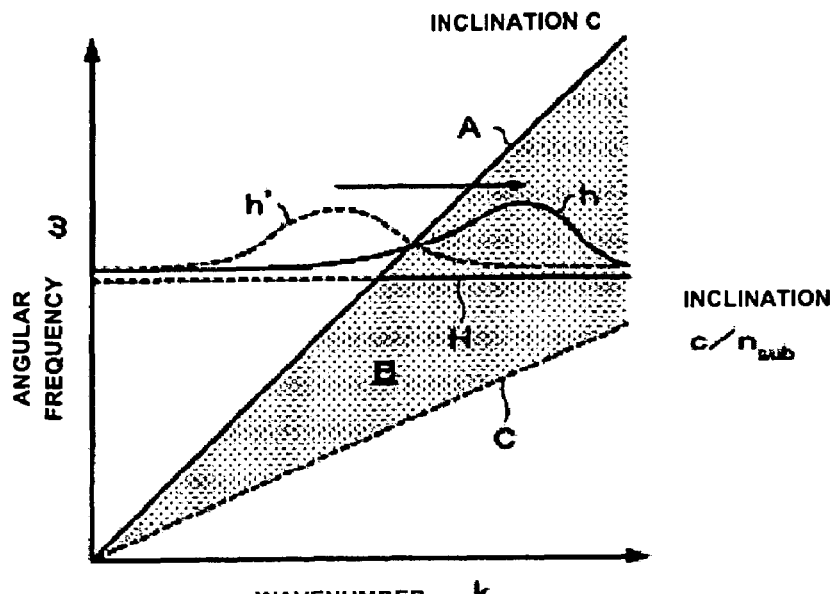

FIG. 10 is a graph in which the distribution of wavenumber components $k_{xy}$ shown in FIG. 9 is superposed, for convenience' sake, with a diagram indicating the relation H of the angular frequency ω with respect to the wavenumber components $k_{xy}$. The inclination of the linear line A is c. The inclination of the linear line C is $c/n_{sub}$. $n_{sub}$ is a refractive index of the substrate 101. The total reflection condition at the boundary between the second mirror 104 and free space, in other words, at the upper surface 104a of the second mirror 104, and more concretely, at the first emission surface 108, is decided by wavenumber components in the transverse direction (a direction in parallel with the x-y plane indicated in FIG. 1). In other words, as described above, the total reflection condition at the boundary (first emission surface 108) between the second mirror 104 and free space is satisfied when $k_{xy}$ has a value within the region B on the right side of the linear line A. As shown in FIG. 10, in the surface-emitting laser 100 in accordance with the present embodiment, the insulation layer 105 has the opening section having a diameter R such that the majority of the peak of the distribution of wavenumber components $k_{xz}$ in the transverse direction in the light of the higher order mode exists in the region B on the right side of the linear line A. In other words, in the surface-emitting laser 100 in accordance with the present embodiment, the insulation layer 105 has the opening section having the diameter R such that the majority of wavenumber components $k_{xy}$ in the transverse direction in the light of the higher order mode satisfies the total reflection condition at the boundary between the second mirror 104 and free space. Accordingly, the light of the higher order mode can totally reflect at the boundary (first emission surface 108) between the second mirror 104 and free space.

It is noted that, in the surface-emitting laser 100 in accordance with the present embodiment, the insulation layer 105 may be provided with an opening section having a diameter R such that at least a part of the peak of the distribution of wavenumber components $k_{xy}$ in the transverse direction in the light of the higher order mode exists in the region B on the right side of the linear line A. In other words, in the surface-emitting laser 100 in accordance with the present embodiment, the insulation layer 105 may be provided with an opening section having a diameter R such that at least a part of wavenumber components $k_{xy}$ in the transverse direction in the light of the higher order mode satisfies the total reflection condition at the boundary between the second mirror 104 and free space.

Also, the total reflection condition at the boundary between the first mirror 102 and free space is decided by wavenumber components in the transverse direction (a direction in parallel with the x-y plane indicated in FIG. 1). In other words, as described above, the total reflection condition at the boundary between the first mirror 102 and the substrate 101, in other words, at the back surface 102b of the first mirror 102, is not satisfied when $k_{xy}$ has a value within the region B on the left side of the linear line C. As shown in FIG. 10, in the surface-emitting laser 100 in accordance with the present embodiment, the insulation layer 105 may be provided with an opening section having a diameter R such that the peak of the distribution h of wavenumber components $k_{xy}$ in the transverse direction in the light of the higher order mode exists in the region B on the left side of the linear line C. In other words, in the surface-emitting laser 100 in accordance with the present embodiment, the insulation layer 105 may be provided with an opening section having a diameter R such that the majority of wavenumber components $k_{xy}$ in the transverse direction in the light of the higher order mode does not satisfy the total reflection condition at the boundary between the first mirror 102 and the substrate 101. Accordingly, the light in the higher order mode cannot totally reflect at the boundary between the first mirror 102 and the substrate 101. As described above, the light of the higher order mode can be totally reflected at the boundary (first emission surface 108) between the second mirror 104 and free space. Consequently, the laser beam of the higher order mode can be emitted in a downward direction (−Z direction indicated in FIG. 1) of the substrate 101 from the second emission surface 118.

Figure 11:
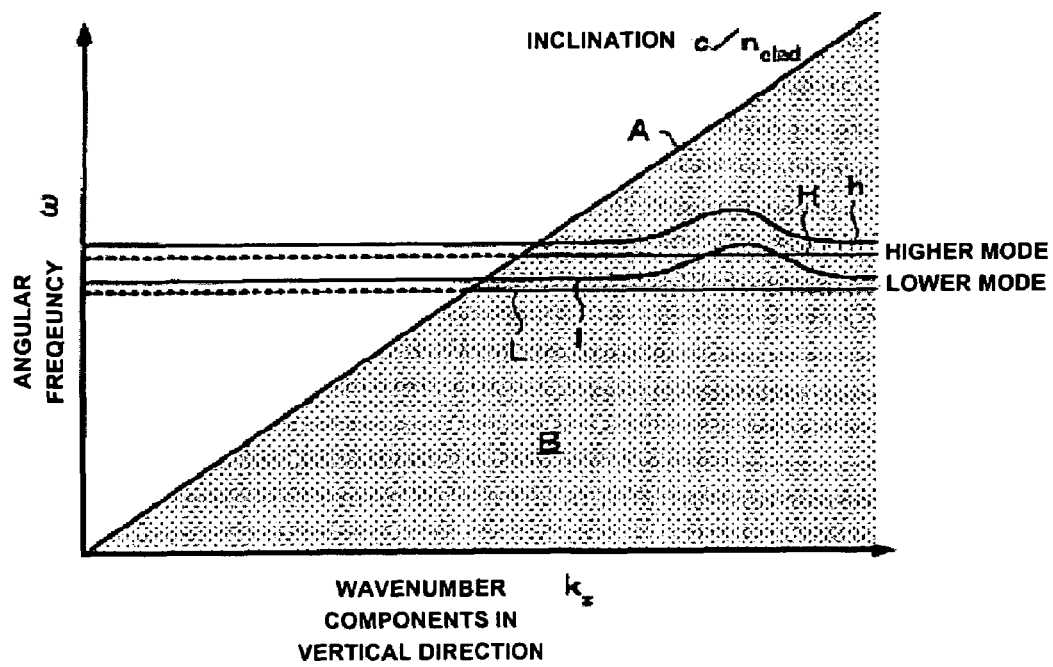
FIG. 11 is a graph in which a distribution I of wavenumber components $k_z$ in the vertical direction of light of a lower order mode in the resonator and a relation L of the angular frequency ω with respect to the wavenumber components $k_z$ in the vertical direction of light of the lower order mode are added to FIG. 8.

FIG. 11 is a graph in which a distribution I of wavenumber components $k_z$ in the vertical direction (Z direction indicated in FIG. 1) of the light of the lower order mode in the resonator 140 and the relation L of the angular frequency ω with respect to the wavenumber components $k_z$ in the vertical direction of the light of the lower order mode are added to FIG. 8. Like the light of the higher order mode described above, in the surface-emitting laser 100 in accordance with the present embodiment as shown in FIG. 11, the insulation layer 105 is provided with the opening section having the diameter R such that the peak of the distribution I of wavenumber components $k_z$ in the vertical direction in the light of the lower order mode exists in the region B on the right side of the linear line A. In other words, in the surface-emitting laser 100 in accordance with the present embodiment, the insulation layer 105 has the opening section having the diameter R such that the majority of wavenumber components $k_z$ in the vertical direction in the light of the lower order mode satisfies the total reflection condition at the boundary between the semiconductor layer vertical cross section and the insulation layer vertical cross section. Accordingly, the light of the lower order mode can totally reflect at the boundary between the semiconductor layer vertical cross section and the insulation layer vertical cross section. Thus, the light in the vertical direction (Z direction indicated in FIG. 1) can be repeatedly reflected by the first mirror 102 and the second mirror 104 which are distributed Bragg reflection type mirrors. Therefore, the surface-emitting laser 100 in accordance with the present embodiment can oscillate the laser beam of the lower order mode.

Figure 12:
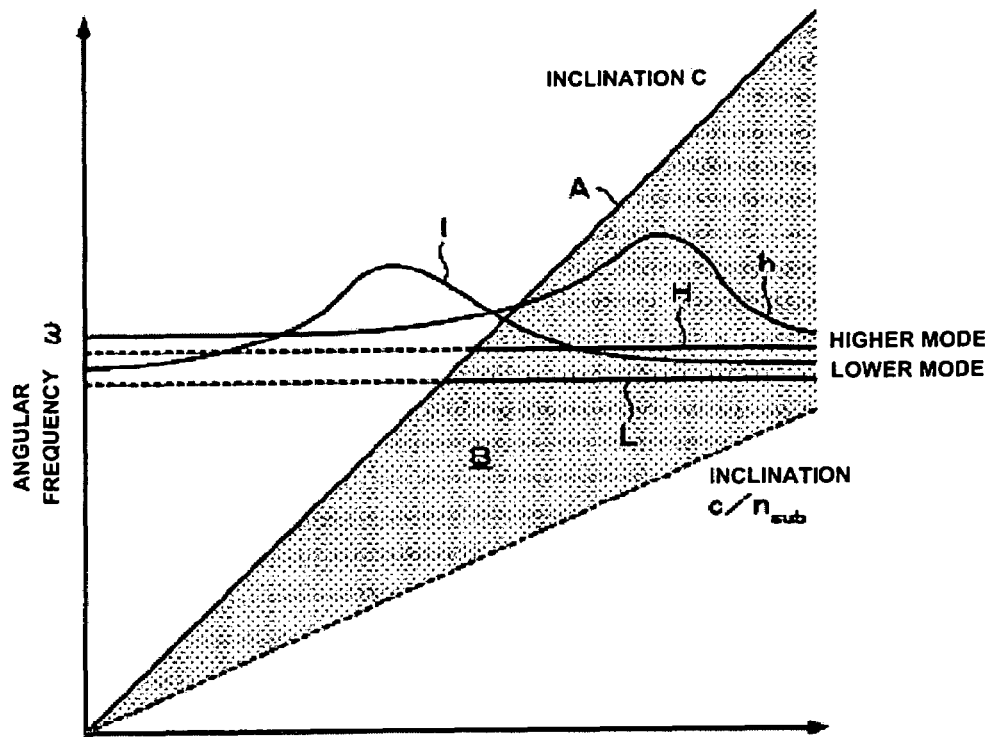
FIG. 12 is a graph in which a distribution I of wavenumber components $k_{xy}$ in the transverse direction of light of the lower order mode in the resonator and a relation L of the angular frequency ω with respect to the wavenumber components $k_{xy}$ in the transverse direction of light of the lower order mode are added to FIG. 10.

FIG. 12 is a graph in which a distribution I of wavenumber components $k_{xy}$ in the transverse direction (a direction in parallel with a X-Y plane indicated in FIG. 1) of the light of the lower order mode in the resonator 140 and the relation L of the angular frequency (o with respect to the wavenumber components $k_{xy}$ in the transverse direction of the light of the lower order mode are added to FIG. 10. As shown in FIG. 12, in the surface-emitting laser 100 in accordance with the present embodiment, the insulation layer 105 may be provided with an opening section having a diameter R such that the peak of the distribution I of wavenumber components $k_{xy}$ in the transverse direction in the light of the lower order mode exists in a region on the left side of the linear line A. In other words, in the surface-emitting laser 100 in accordance with the present embodiment, the insulation layer 105 may be provided with an opening section having a diameter R such that the majority of wavenumber components $k_{xz}$ in the transverse direction in the light of the lower order mode does not satisfy the total reflection condition at the boundary between the second mirror 104 and free space. Accordingly, the light in the lower order mode cannot totally reflect at the boundary between the second mirror 102 and free space. Then, as described above, the first mirror 102 is formed with a number of pairs greater than the number of pairs of the second mirror. Therefore, the laser beam of the lower order mode can be emitted in an upward direction (+Z direction indicated in FIG. 1) of the substrate 101 from the first emission surface 108.

Figure 13:
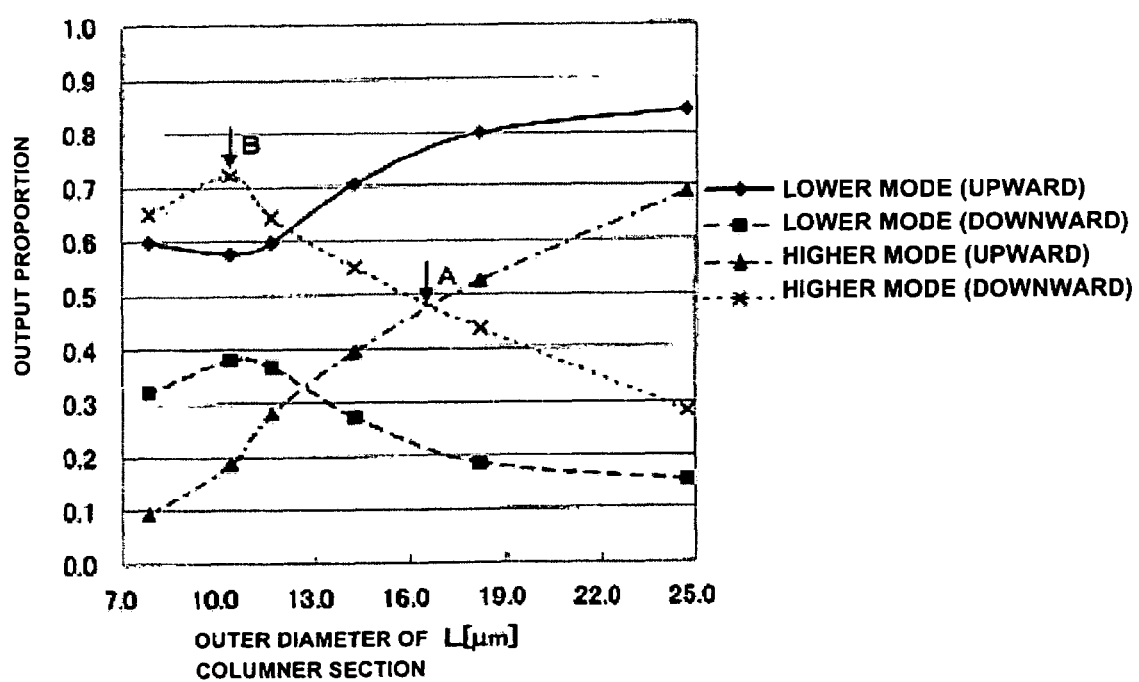
FIG. 13 is a graph showing the relation between output proportions in the upward direction and output proportions in the downward direction of the substrate in laser beams of the lower and higher order modes with respect to the outer diameter L of the columnar section.
Figure 14:
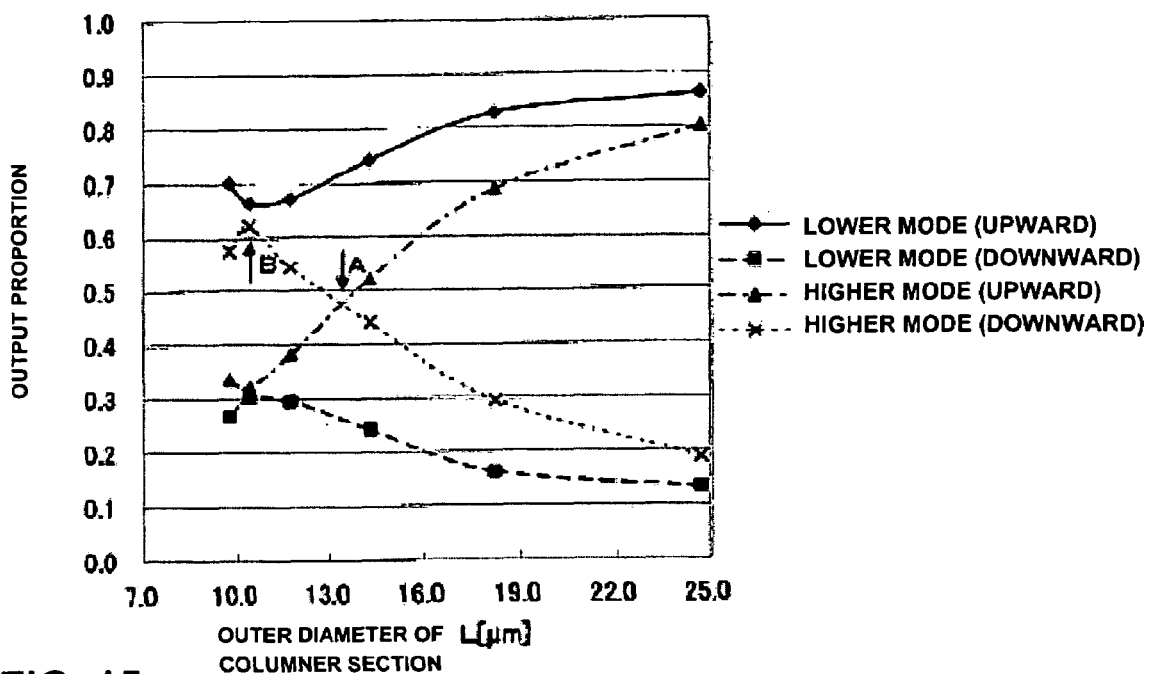
FIG. 14 is a graph showing the relation between output proportions in the upward direction and output proportions in the downward direction of the substrate in laser beams of the lower order mode and the higher order mode with respect to the outer diameter L of the columnar section.
Figure 15:
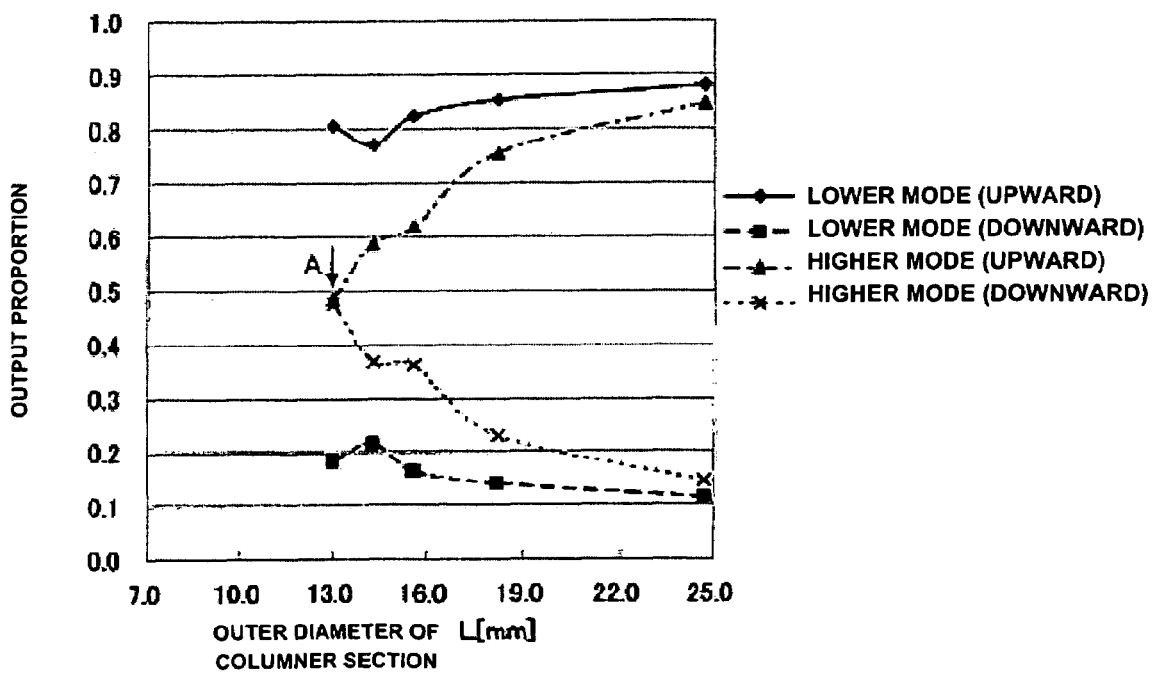
FIG. 15 is a graph showing the relation between output proportions in the upward direction and output proportions in the downward direction of the substrate in laser beams of the lower order mode and the higher order mode with respect to the outer diameter L of the columnar section.

Moreover, in the surface-emitting laser 100 in accordance with the present embodiment, as described above, the outer diameter L of the columnar section 130 is formed such that the output of the laser beam of the higher order mode to be emitted in the downward direction (−Z direction indicated in FIG. 1) of the substrate 101 can be made greater than the output of the laser beam of the higher order mode to be emitted from the upward direction (+Z direction indicated in FIG. 1) of the substrate 101. This is described with reference to FIGS. 13-15. FIGS. 13-15 show the relation between output proportions in the upward direction and output proportions in the downward direction of the substrate 101 in laser beams of a lower order mode ($0^{th}$ order mode in the illustrated example) and a higher order mode ($1^{st}$ order mode in the illustrated example) with respect to the outer diameter L of the columnar section 130 (hereafter also referred to as the "output proportion with respect to the outer diameter L of the columnar section"). FIG. 13 shows the case where the diameter R of the opening section of the insulation layer 105 is 6.0 μm, FIG. 14 shows the case where the diameter R of the opening section of the insulation layer 105 is 8.0 μm, and FIG. 15 shows the case where the diameter R of the opening section of the insulation layer 105 is 11.0 μm.

It is noted that, in the surface-emitting lasers in the examples shown in FIGS. 13-15, the diameter R of the opening section of the insulation layer 105 may preferably be about 6.0-11.0 μm. If the diameter R of the opening section of the insulation layer 105 is less than 6.0 μm, only the $0^{th}$ mode oscillates, and if it is greater than 11.0 μm, inversion of the output proportions of light beams of the higher order mode in the upward and downward directions of the substrate 101 does not occur.

As shown in FIGS. 13-15, in the laser beam of the higher order mode, a first line indicating the relation of the output proportion in the upward direction of the substrate 101 with respect to the outer diameter L of the columnar section (a line indicating the "higher order mode (upward direction)" in the illustrated example) can intersect a second line indicating the relation of the output proportion in the downward direction of the substrate 101 with respect to the outer diameter L of the columnar section (a line indicating the "higher order mode (downward direction)" in the illustrated example). Concretely, as shown in FIGS. 13-15, the first line intersects the second line at an intersection point indicated by an arrow A. Then, the outer diameter L of the columnar section 130 can be made smaller than an outer diameter L of the columnar section 130 at which the first line (the line indicating the "higher order mode (upward direction)") and the second line (the line indicating the "higher order mode (downward direction)") intersect each other (as indicated by the arrow A). Accordingly, as shown in FIGS. 13-15, the output proportion (i.e., the output) of the laser beam of the higher order mode emitted in the downward direction (−Z direction in FIG. 1) of the substrate 101 can be made greater than the output proportion (i.e., the output) of the laser beam of the higher order mode emitted in the upward direction (+Z direction in FIG. 1) of the substrate 101. The output proportion of the laser beam of the higher order mode emitted in the downward direction of the substrate 101 can become the maximum value at a point indicated by an arrow B. In other words, in the surface-emitting laser 100 in accordance with the present embodiment, for example, when the columnar section 130 has an outer diameter L at the point indicated by the arrow B, the output proportion of the laser beam of the higher order mode emitted in the downward direction of the substrate 101 can be maximized. More specifically, for example, as shown in FIG. 14, when the diameter R of the opening section of the insulation layer 105 is 8 μm, the optimum outer diameter L of the columnar section 130 may be about 10.5 μm.

In the examples shown in FIGS. 13-15, the $0^{th}$ mode and the $1^{st}$ mode are used, such that the device becomes smaller, and its output also becomes smaller. By this, in terms of improving the functions of the optical circuit, the optical circuit can be made in a higher density, and its power consumption can be reduced. Also, when the surface-emitting laser 100 in accordance with the present embodiment is used for optical communications, higher order modes (for example, the $2^{nd}$ mode and $3^{rd}$ mode, or the like) with which a desired output can be obtained can be used depending on the requirements.

It is noted that all of the numerical values of the examples indicated in FIGS. 13-15 are values when a wavelength in an 850 nm band is used. However, by using the structure having a size that is proportional to a wavelength to be used, similar results can be obtained with respect to the desired wavelength. More specifically, for example, when a wavelength in a 1.3 μm band is used, the numerical values of the examples indicated in FIGS. 13-15 may be multiplied by (1300/850), whereby similar results can be obtained.

Also, by changing the inclination angle θ of the side surface of the columnar section 130, the output of the laser beam of the higher order mode emitted in the downward direction of the substrate 101 can be made greater than the output of the laser beam of the higher order mode emitted in the upward direction of the substrate 101. This is because the distribution of wavenumber components $k_{xy}$ in the transverse direction (the direction in parallel with the x-y plane indicated in FIG. 1) changes when the inclination angle θ of the side surface of the columnar section 130 is changed.

Also, in the surface-emitting laser 100 in accordance with the present embodiment, a ratio of the sum of the output of the laser beam of the lower order mode and the output of the laser beam of the higher order mode which are emitted in the downward direction of the substrate 101 to the sum of the output of the laser beam of the lower order mode and the output of the laser beam of the higher order mode which are emitted in the upward direction of the substrate 101 can change according to an excitation state by at least one of current and light. Concretely, the following takes place.

First, the excitation by current is described. For example, the more the current to be injected in the active layer 103 is increased, the more the higher order mode can predominantly oscillate, compared to the lower order mode (see *A Comprehensive Model for the Modal Dynamics of Vertical-Cavity Surface-Emitting Lasers*: IEEE Journal of Quantum Electronics, Vol38, No2, February 2002). Also, as described above, in the surface-emitting laser 100 in accordance with the present embodiment, the output of the laser beam of the higher order mode emitted in the downward direction (−Z direction in FIG. 1) of the substrate 101 can be made greater than the output of the laser beam of the higher order mode emitted in the upward direction (+Z direction in FIG. 1) of the substrate 101. Accordingly, in the surface-emitting laser 100 in accordance with the present embodiment, when the current amount of injection current, for example, is increased, the sum of the output of the laser beam of the lower order mode and the output of the laser beam of the higher order mode which are emitted in the upward direction of the substrate 101 can be reduced, and the sum of the output of the laser beam of the lower order mode and the output of the laser beam of the higher order mode which are emitted in the downward direction of the substrate 101 can be increased. In other words, in the surface-emitting laser 100 in accordance with the present embodiment, the output ratio of laser beams emitted in the upward and downward directions of the substrate 101 can be switched according to the amount of injection current.

Also, in the case of the photoexcitation, the output ratio of laser beams emitted in the upward and downward directions of the substrate 101 can be switched according to the intensity of excited light, the irradiation position of excited light, or the phase of excited light of two light sources. More specifically, for example, when the light amount of excited light is increased, the sum of the output of the laser beam of the lower order mode and the output of the laser beam of the higher order mode which are emitted in the upward direction of the substrate 101 can be reduced, and the sum of the output of the laser beam of the lower order mode and the output of the laser beam of the higher order mode which are emitted in the downward direction of the substrate 101 can be increased. Excited light can be entered from the side surface of the active layer 103, for example. It is noted that photoexcitation and current-excitation can be combined.

Accordingly, by changing the excitation state by at least one of current and light, the output ratio of laser beams emitted in the upward and downward directions of the substrate 101 can be switched.

It is noted that, in order to adjust at least one of the current amount and the light amount for changing the output ratio without substantially changing the basic output ratio of laser beams emitted in the upward and downward directions of the substrate 101, for example, at least one of the depth H of a portion of the columnar section 130 below the lower surface of the insulation layer 105 and the inclination angle θ of the side surface of the columnar section 130 may be changed. This is possible-because, when the depth H of the portion of the columnar section 130 below the lower surface of the insulation layer 105 is changed, the current confinement slightly changes, such that the in-plane distribution of the gain changes, and the thermal resistance (waste heat efficiency) changes, whereby the readiness of oscillation of each of the modes (the lower order mode and the higher order mode) changes. Also, it is because the light confinement is slightly influenced, when the inclination angle θ of the side surface of the columnar section 130 is changed, which changes the readiness of oscillation of each of the modes.

1-3 Device Manufacturing Method

An example of a method for manufacturing the surface emitting laser 100 in accordance with a first embodiment of the present invention is described with reference to FIG. 1, FIG. 2, and FIG. 16 to FIG. 20.

FIG. 16 to FIG. 20 are cross-sectional views schematically showing the steps of the method for manufacturing the surface-emitting laser 100 according to the present embodiment shown in FIG. 1 and FIG. 2, each of which corresponds to the cross section indicated in FIG. 1.

Figure 16:
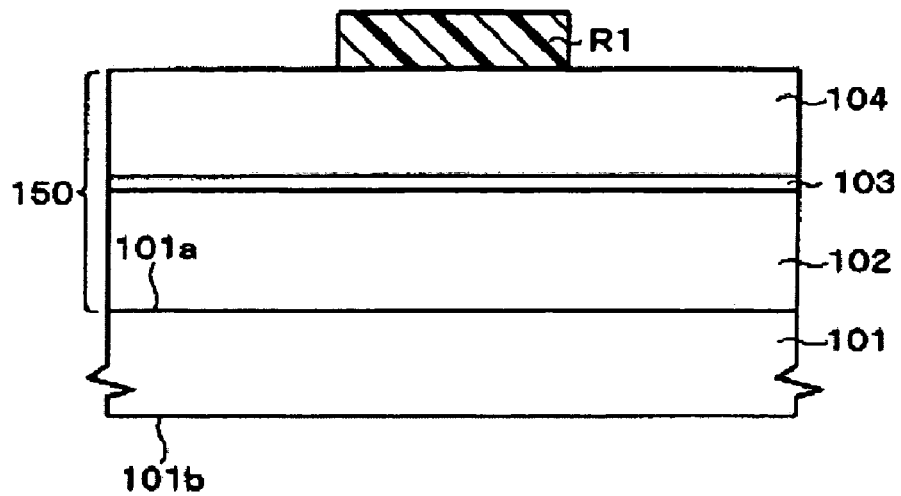
FIG. 16 is a cross-sectional view schematically showing a step of manufacturing a surface-emitting laser in accordance with an embodiment.

First, as shown in FIG. 16, on a surface of a semiconductor substrate 101 composed of n-type GaAs, a semiconductor multilayer film 150 is formed by epitaxial growth while modifying the composition. It is noted here that the semiconductor multilayer film 150 is formed from, for example, a first mirror 102 of 37.5 pairs of alternately laminated n-type $Al_{0.9}Ga_{0.1}As$ layers and n-type $Al_{0.15}Ga_{0.85}As$ layers, an active layer 103 composed of GaAs well layers and $Al_{0.3}Ga_{0.7}As$ barrier layers in which the well layers include a quantum well structure composed of three layers, and a second mirror 104 of 25 pairs of alternately laminated p-type $Al_{0.9}Ga_{0.1}As$ layers and p-type $Al_{0.15}Ga_{0.85}AS$ layers. These layers are successively laminated on the substrate 101 to thereby form the semiconductor multilayer film 150. It is noted that the composition of each of the layers and the number of the layers forming the first mirror 102, the active layer 103 and the second mirror 104 are not particularly limited to the above.

When growing the second mirror 104, at least one layer thereof adjacent to the active layer 103 is formed as an AlAs layer or an AlGaAs layer that is later oxidized and becomes an insulation layer 105 (see FIG. 1).

The Al composition of the AlGaAs layer that becomes the insulation layer 105 may be 0.95 or greater. It is noted that the uppermost surface layer of the second mirror 104 may preferably be formed with a high carrier density such that ohm contact can be readily made with an electrode (first electrode 107).

The temperature at which the epitaxial growth is conducted is appropriately decided depending on the growth method, the kind of raw material, the type of the substrate 101, and the kind, thickness and carrier density of the semiconductor multilayer film 150 to be formed, and in general may preferably be 450° C.-800° C. Also, the time required for conducting the epitaxial growth is appropriately decided, like the temperature. Also, a metal-organic chemical vapor deposition (MOVPE: Metal-Organic Vapor Phase Epitaxy) method, a MBE method (Molecular Beam Epitaxy) method or a LPE (Liquid Phase Epitaxy) method can be used as a method for the epitaxial growth.

Then, resist is coated on the semiconductor multilayer film 150, and then the resist is patterned by a photolithography method, thereby forming a resist layer R1 having a specified pattern, as shown in FIG. 16. The resist layer R1 is formed above an area wider than an area where a columnar section 130 (see FIG. 1) is planned to be formed.

Figure 17:
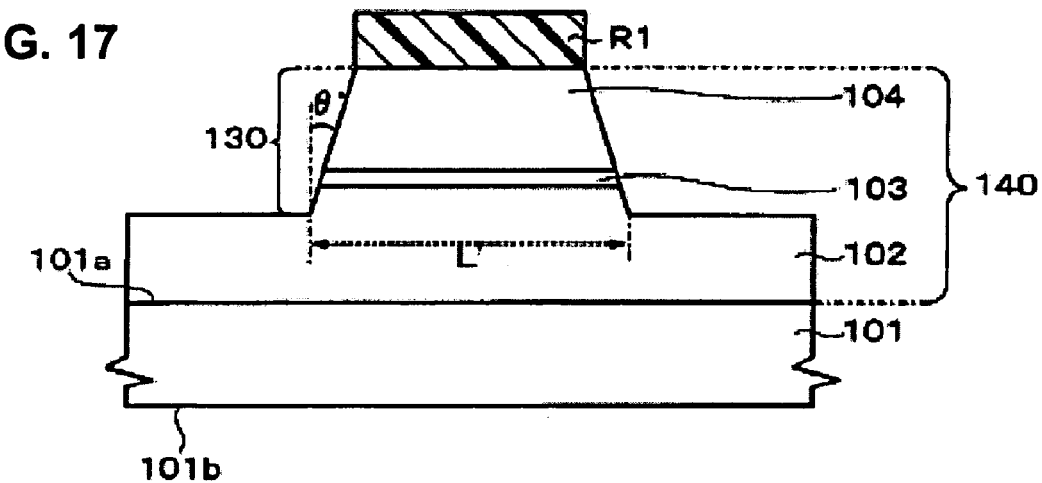
FIG. 17 is a cross-sectional view schematically showing a step of manufacturing the surface-emitting laser in accordance with the embodiment.

Next, by using the resist layer R1 as a mask, the second mirror 104, the active layer 103 and a part of the first mirror 102 are etched (first etching) by, for example, a dry etching method, thereby forming a pillar-shaped semiconductor deposited body (columnar section) 130, as shown in FIG. 17 (first etching step). The outer diameter L' of the columnar section 130 after the first etching step can be formed to be larger than the outer diameter L of the columnar section 130 to be finally made (see FIG. 1). Also, the outer diameter L' of the columnar section 130 formed by the first etching step is formed such that an output of a laser beam of a higher order mode emitted in the upward direction of the substrate 101 is greater than an output of a laser beam of the higher order mode emitted in the downward direction of the substrate. In other words, for example, in the examples shown in FIG. 13-FIG. 15, the outer diameter L' of the columnar section 130 formed by the first etching step can be formed to have a value greater than the outer diameter of the columnar section at the intersecting point indicated by the arrow A. The outer diameter L' of the columnar section 130 is, as shown in FIG. 17, an outer diameter of the columnar section 130 at its lowest end. The outer diameter L' of the columnar section 130 is, for example, about 25 µm.

Also, the side surface of the columnar section 130 after the first etching can be formed to be inclined gentler than the inclination of the side surface of the columnar section 130 to be finally made. The side surface of the columnar section 130 after the first etching is inclined at an angle θ with respect to the vertical upward direction (+Z direction) of the substrate 101. Then, the resist layer R1 is removed.

Figure 18:
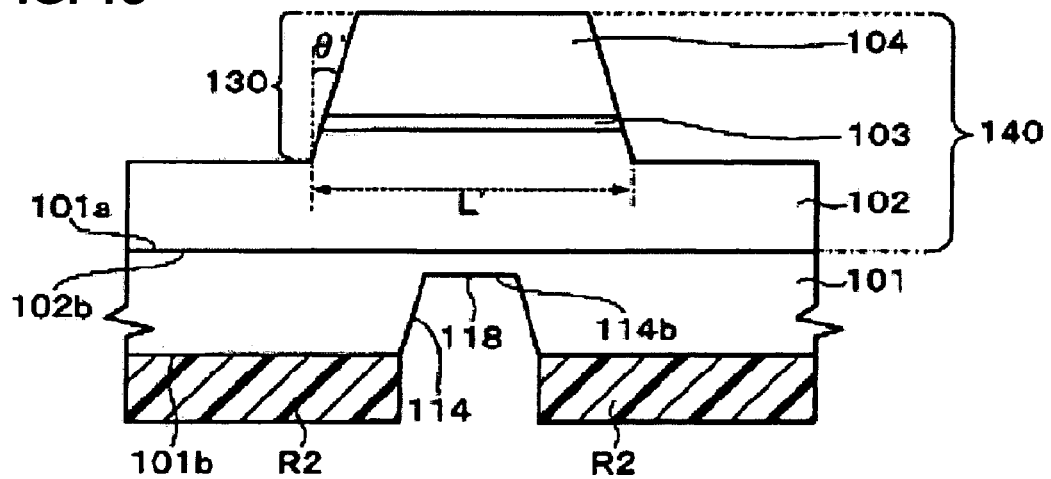
FIG. 18 is a cross-sectional view schematically showing a step of manufacturing the surface-emitting laser in accordance with the embodiment.

Next, resist is coated on a back surface 101b of the substrate 101, and then the resist is patterned by a lithography method, thereby forming a resist layer R2 having a predetermined pattern, as shown in FIG. 18. The resist layer R2 is formed in an area other than the area where an opening section 114 (see FIG. 1) is planned to be formed.

Then, by using the resist layer R2 as a mask, the substrate 101 is etched from the side of the back surface 101b by a dry etching method or a wet etching method, thereby forming the opening section 114. In the illustrated example, the opening section 114 is formed in a depth that does not penetrate the substrate 101. A bottom surface 114b of the opening section 114 defines a second emission surface 118. Then, the resist layer R2 is removed.

Figure 19:
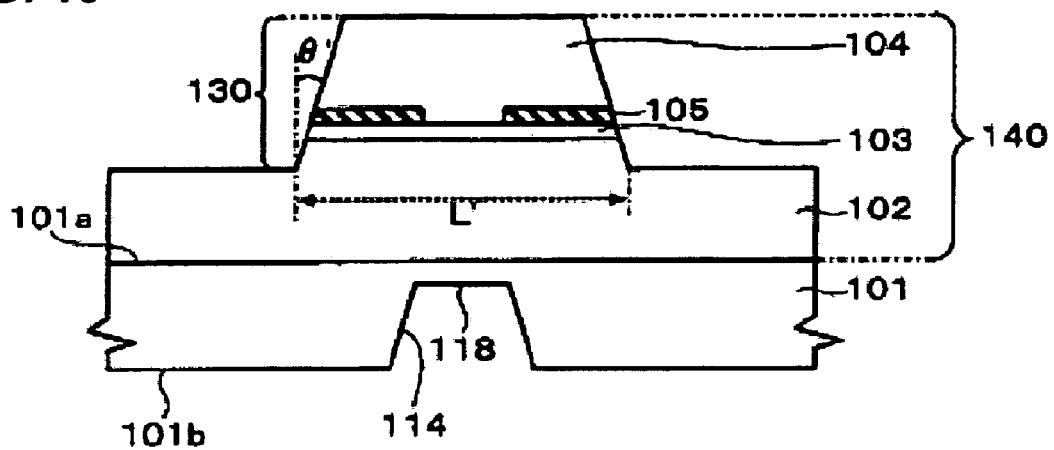
FIG. 19 is a cross-sectional view schematically showing a step of manufacturing the surface-emitting laser in accordance with the embodiment.

Next, by placing the substrate 101 on which the columnar section 130 is formed through the aforementioned steps in a water vapor atmosphere at about 400° C., for example, the AlGaAs layer that is to become the insulation layer 105 in the second mirror 104 is oxidized from its side surface, thereby forming the insulation layer 105, as shown in FIG. 19. The oxidation rate depends on the temperature of the furnace, the amount of water vapor supply, and the Al composition and the film thickness of the layer to be oxidized. By adjusting the oxidation rate and the oxidation time, the diameter R of the opening section of the insulation layer 105 can be formed such that a laser beam of a higher order mode can be emitted in the downward direction of the substrate 101.

Figure 20:
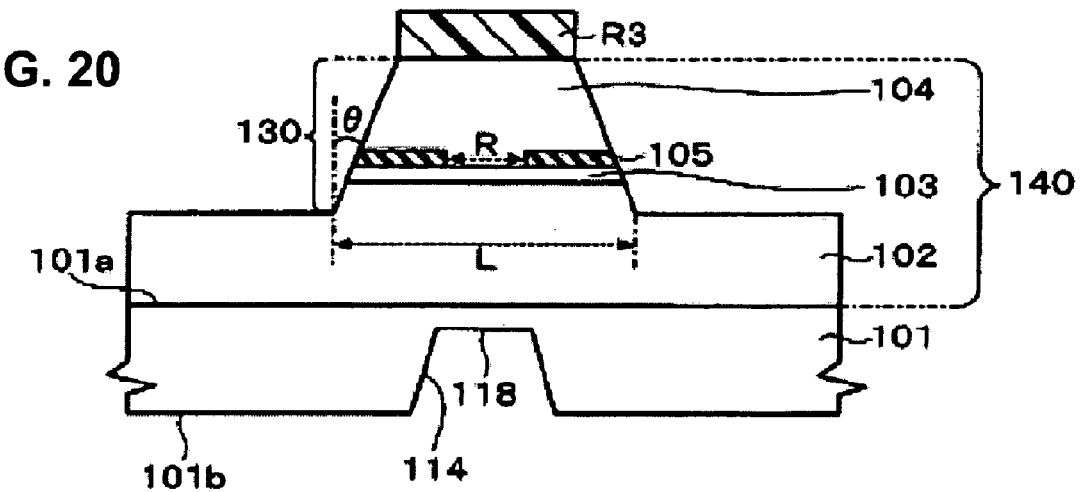
FIG. 20 is a cross-sectional view schematically showing a step of manufacturing the surface-emitting laser in accordance with the embodiment.

Next, resist is coated at least on the columnar section 130, and then the resist is patterned by a lithography method, thereby forming a resist layer R3 having a predetermined pattern, as shown in FIG. 20. The resist layer R3 is formed above an area where the columnar section 130 (see FIG. 1) is planned to be formed.

Next, as shown in FIG. 20, by using the resist R3 as a mask, the second mirror 104, the insulation layer 105, the active layer 103 and a part of the first mirror 102 are etched (second etching) by, for example, a dry etching method, thereby reducing the outer diameter of the columnar section 130 (second etching step). The outer diameter of the columnar section 130 formed by the second etching step can be formed such that an output of a laser beam of a higher order mode emitted in the downward direction of the substrate 101 is greater than an output of a laser beam of the higher order mode emitted in the upward direction of the substrate 101. The outer diameter L of the columnar section 130 is, as shown in FIG. 20, an outer diameter of the columnar section 130 at its lowest end.

Also, the side surface of the columnar section 130 formed by the second etching can be formed to be inclined such that an output of a laser beam of a higher order mode emitted in the downward direction of the substrate 101 is greater than an output of a laser beam of the higher order mode emitted in the upward direction of the substrate 101. The side surface of the columnar section 130 is inclined at an angle θ with respect to the vertical upward direction (+Z direction) of the substrate 101. Then, the resist layer R3 is removed.

Figure 21:
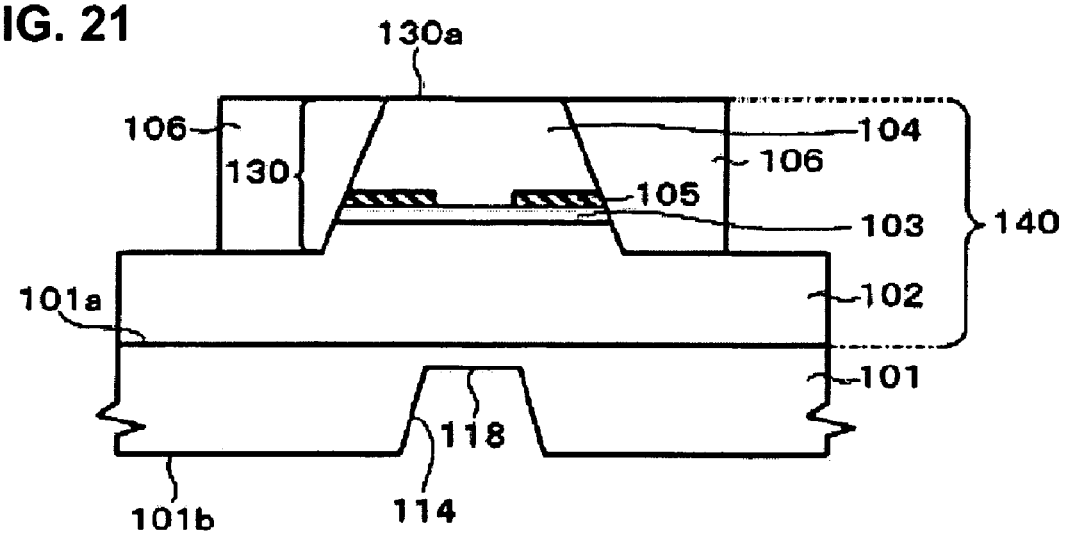
FIG. 21 is a cross-sectional view schematically showing a step of manufacturing the surface-emitting laser in accordance with the embodiment.

Next, as shown in FIG. 21, an embedding insulation layer 106 that surrounds the columnar section 130, in other words, a part of the first mirror 102, the active layer 103 and the second mirror 104, is formed.

Here, an example in which polyimide resin is used as a material for forming the embedding insulation layer 106 is described. First, a precursor (polyimide precursor) is coated on the substrate 101 having the columnar section 130 by using, for example, a spin coat method, to thereby form a precursor layer. In this instance, the precursor layer is formed such that its film thickness is greater than the height of the columnar section 130. As the method of coating the precursor, besides the aforementioned spin coat method, another known technique, such as, a dipping method, a spray coat method, an ink jet method or the like can be used.

Then, the substrate 101 is heated by using, for example, a hot plate or the like, to remove the solvent, and then is placed in a furnace at about 350° C. to imidize the precursor layer, thereby forming a polyimide resin layer that is almost completely hardened. Then, as shown in FIG. 21, an upper surface 130a of the columnar section 130 is exposed, thereby forming the embedding insulation layer 106. As a method for exposing the upper surface 130a of the columnar section 130, a CMP method, a dry etching method, a wet etching method or the like can be used. Also, the embedding insulation layer 106 may also be formed from a resin having photosensitivity. The embedding insulation layer 106 can be patterned by a lithography technique and an etching technique if necessary.

Next, the steps of forming a first electrode 107 and a second electrode 109 for injecting an electric current into the active layer 103, and a first emission surface 108 of a laser beam (see FIG. 1 and FIG. 2) are described.

First, prior to forming the first electrode 107 and the second electrode 109, exposed upper surfaces of the first mirror 102 and the second mirror 104 may be washed by using a plasma treatment method or the like, if necessary. As a result, a device of more stable characteristics can be formed. Then, a layer (not shown) that becomes the first electrode 107 is formed on an upper surface of the embedding insulation layer 106 and the columnar section 130 by, for example, a vacuum deposition method. The layer that becomes the first electrode 107 is composed of, for example, a multilayer film of an alloy of Au and Zn, and Au. Then, a portion where the multilayer film is not formed is formed on the upper surface of the columnar section 130 by a lift-off method. This portion becomes an emission surface 108 (see FIG. 1 and FIG. 2). It is noted that, in the above step, a dry etching method or a wet etching method can be used instead of the lift-off method.

Also, a layer (not shown) that becomes the second electrode 109 is formed on an exposed upper surface 102a of the first mirror 102 by, for example, a vacuum deposition method. The layer that becomes the second electrode 109 may be composed of a multilayer film of Au and an alloy of Au and Ge, for example. Then, an annealing treatment is conducted. The temperature of the annealing treatment depends on the electrode material. This is usually conducted at about 400° C. for the electrode material used in the present embodiment. By the steps described above, the first electrode 107 and the second electrode 109 are formed.

By the process described above, the surface-emitting type semiconductor laser 100 shown in FIG. 1 and FIG. 2 can be obtained.

1-4. Action and Effect

According to the surface-emitting laser 100 in accordance with the present embodiment, a laser beam of a lower order mode can be emitted in an upward direction of the substrate 101, and a laser beam of a higher order mode can be emitted in a downward direction of the substrate 101.

Also, according to the surface-emitting laser 100 in accordance with the present embodiment, the output of the laser beam of the higher order mode emitted in the downward direction of the substrate 101 can be made greater than the output of the laser beam of the higher order mode emitted in the upward direction of the substrate 101.

Also, according to the surface-emitting laser 100 in accordance with the present embodiment, the output ratio of laser beams emitted in the upward and downward directions of the substrate 101 can be changed by changing the excitation state by at least one of current and light.

According to the method for manufacturing the surface-emitting laser 100 in accordance with the present embodiment, the outer diameter L' of the columnar section 130 formed by the first etching step is formed such that an output of the laser beam of the higher order mode emitted in the upward direction of the substrate 101 is greater than an output of the laser beam of the higher order mode emitted in the downward direction of the substrate 101. Accordingly, the first etching step can be conducted under the same condition as the etching condition for forming a columnar section of a surface-emitting laser that emits almost all of the laser beams of a lower order mode and a higher order mode in the upward direction of the substrate 101.

Also, according to the method for manufacturing the surface-emitting laser 100 in accordance with the present embodiment, the first etching step for forming the columnar section 130, and the second etching step for reducing the outer diameter of the columnar section 130 are conducted. By this, when a plurality of surface-emitting lasers are arranged in an array configuration on the same substrate, one portion of the surface-emitting lasers may be formed such that the output of each laser beam of a higher order mode to be emitted in a downward direction of the substrate 101 becomes greater than the output of each laser beam of a higher order mode to be emitted in an upward direction of the substrate 101, and another portion of the surface-emitting lasers may be formed such that almost all of the laser beams of a lower order mode and a higher order mode are emitted in the upward direction of the substrate 101 (hereafter, referred to as "upward directed emission surface-emitting lasers"). In this case, when the second etching step is conducted, an area where the upward directed emission surface-emitting lasers are formed may be masked by a resist, for example.

Also, according to the method for manufacturing the surface-emitting laser 100 in accordance with the present embodiment, the first etching step for forming the columnar section 130, the step of oxidizing a layer in the columnar section 130 from its side surface to form the insulation layer 105 to have an opening section, and the second etching step for reducing the outer diameter of the columnar section 130 are conducted. By this, when the insulation layer 105 is formed, the outer diameter L' of the columnar section 130 may be made larger to some extent (can be made larger than at least the outer diameter L of the columnar section 130 to be finally made). When the outer diameter L' of the columnar section 130 is larger to some extent, a desired aperture diameter R of the opening section of the insulation layer 105 can be obtained with a higher accuracy. Accordingly, by the method for manufacturing the surface-emitting laser 100 in accordance with the present embodiment, the desired aperture diameter R can be obtained with a higher accuracy. Then, in the second etching step, the outer diameter of the columnar section 130 is reduced, such that the desired outer diameter L of the columnar section 130 can also be obtained with a higher accuracy.

1-5. Application Example

In the example described above, the description is made as to the case where the optical element 100 is a surface-emitting laser. However, the present invention is also applicable to devices other than surface-emitting lasers.

For example, the present invention is applicable to optical switches. As described above, the optical element 100 in accordance with the present embodiment can switch the output ratio of laser beams to be emitted in the upward and downward directions by changing the excitation state by at least one of current and light. In other words, the optical element 100 in accordance with the present embodiment functions as an optical switch. By applying the present invention to optical switches, the degree of freedom in designing optical circuits improves, and higher performance and miniaturization of optical circuits can be achieved.

Furthermore, for example, the present invention is applicable to optical branching ratio variable elements. In this case, the active layer 103 of the resonator 140 in the surface-emitting laser 100 can be replaced with an incident layer 103. It is noted that, while the active layer 103 has the gain, the incident layer 103 may have the gain or may not have the gain. The incident layer 103 may be composed of the same material as that of the active layer 103 in the surface-emitting laser 100. In the optical branching ratio variable element, the branching ratio of light beams emitted in the upward and downward directions of the substrate 101 can be changed according to the receiving light intensity of light received by the incident layer 103 or the receiving light condition of a light receiving section (that may include a portion that would likely be coupled with a lower order mode and a portion that would likely be coupled with a higher order mode). It is noted that incident light can be entered from the side surface of the incident layer 103.

Preferred embodiments of the present invention are described above, but the present invention is not limited to them, and various modes can be made. For example, interchanging the p-type and n-type of each of the semiconductor layers in the above described embodiments does not deviate from the subject matter of the present invention.

Also, in the embodiment described above, an example in which the second emission surface 118 is provided by forming the opening section 114 in the substrate 101 is described. However, for example, it is possible that the opening section 114 is not formed in the substrate 101. In this case, an optical waveguide path may be formed in the substrate 101, and light emitted from the resonator 140 may be guided by the optical waveguide path. In this instance, light of a higher order mode can be totally reflected at a boundary between the back surface 101b of the substrate 101 and free space. Accordingly, the incidence efficiency of the light of the higher order mode entered in the optical waveguide path can be increased. In other words, the optical loss that may be caused by emission of the light of the higher order mode from the back surface 101b of the substrate 101 can be reduced. A material that absorbs the laser beam emitted from the resonator 140 or a material that does not absorb the same may be used as the substrate 101.

Also, a sacrificial layer may be formed between the substrate 101 and the resonator 140, and then the sacrificial layer may be etched such that the resonator 140 is separated (by epitaxial lift-off) from the substrate 101, and bonded to another substrate (see Japanese Laid-open Patent Application 2004-22901 or Japanese Laid-open Patent Application 2004-47691). A material that absorbs the laser beam emitted from the resonator 140 or a material that does not absorb the same may be used as the other substrate. Also, the opening section 114 may be formed in the other substrate, or the opening section 114 may not be formed.

Also, in the embodiment of the present invention described above, the description is made as to an example in which light emitted from the first emission surface 108 and the second emission surface 118 is incident upon free space, in other words, the exterior of the surface-emitting laser 100 is free space. However, for example, light emitted from the first emission surface 108 or the second emission surface 118 may directly enter an optical waveguide path or a photo diode. In this case, the surface-emitting laser 100 in accordance with the present embodiment can be used in a three-dimensional optical circuit, an optical integrated circuit, or the like. More specifically, the first emission surface 108 may be in contact with a material having a refractive index lower than the refractive index of the second mirror 104, such as, for example, a material composed of SiN, $SiO_2$ or $Al_2O_3$. The second emission surface 118 may be in contact with a material having a refractive index lower than the refractive index of the substrate 101, such as, for example, a material composed of SiN, $SiO_2$ or $Al_2O_3$.

Also, in the embodiment of the present invention described above, the description is made as to an example in which each of the lower order mode and the higher order mode is composed of a single mode. However, at least one of the lower order mode and the higher order mode may consist of a plurality of modes. More specifically, for example, the lower order mode may consist of the $0^{th}$ mode and the $1^{st}$ mode, and the higher order mode may consist of the $2^{nd}$ mode, the $3^{rd}$ mode and the $4^{th}$ mode.

Also, in the embodiment of the present invention described above, the description is made as to an example in which the first etching step for forming the columnar section 130 and the second etching step for reducing the outer diameter of the columnar section 130 are conducted. However, for example, without conducting the second etching step, a desired outer diameter L of the columnar section 130 may be obtained by conducting the first etching step.

Also, in the embodiment of the present invention described above, the description is made as to the use of AlGaAs system material. However, depending on oscillation wavelengths, for example, semiconductor materials of AlGaP system, GaInP system, ZnSSe system, InGaAs system, InGaN system, AlGaN system, GaInNAs system, GaAsSb system and other material system may be used.

What is claimed is:

1. A surface-emitting type semiconductor laser comprising:
   a substrate;
   a first distributed Bragg reflection type mirror formed above the substrate;

an active layer formed above the first distributed Bragg reflection type mirror;

a second distributed Bragg reflection type mirror formed above the active layer; and an insulation layer having an opening section formed in one of the first distributed Bragg reflection type mirror and the second distributed Bragg reflection type mirror, wherein:

a part of the first distributed Bragg reflection type mirror, the active layer, the second distributed Bragg reflection mirror and the insulation are formed in a columnar section such that a diameter of an upper side of the columnar section is formed smaller than a diameter of a bottom side of the columnar section, light generated from the active layer is emitted as a laser beam of a lower order mode or a laser beam of a higher order mode, the opening section in the insulation layer is formed to have a size that enables the laser beam of the higher order mode to be totally reflected at an upper surface of the second distributed Bragg reflection type mirror, at least the second distributed Bragg reflection type mirror defines the columnar section, a side surface of the columnar section is inclined such that the second distributed Bragg reflection type mirror, the insulation layer, the active layer, and at least part of the first distributed Bragg reflection type mirror are continuously conically shaped, and the output of the laser beam of the higher order mode emitted in the downward direction of the substrate is greater than the output of the laser beam of the higher order mode emitted in the upward direction of the substrate.

2. An optical switch including:
the surface-emitting type semiconductor laser according to claim 1.

3. An optical branching ratio variable element comprising:
a substrate;
a first distributed Bragg reflection type mirror formed above the substrate;

an incident layer formed above the first distributed Bragg reflection type mirror;

a second distributed Bragg reflection type mirror formed above the incident layer; and an insulation layer having an opening section formed in one of the first distributed Bragg reflection type mirror and the second distributed Bragg reflection type mirror, wherein:

a part of the first distributed Bragg reflection type mirror, the incident layer, the second distributed Bragg reflection mirror and the insulation being formed in a columnar section such that a diameter of an upper side of the columnar section is formed smaller than a diameter of a bottom side of the columnar section, light incident upon the incident layer is emitted as a laser beam of a lower order mode or a laser beam of a higher order mode, the first distributed Bragg reflection type mirror is formed with a number of pairs greater than a number of pairs of the second distributed Bragg reflection type mirror such that the laser beam of the lower order mode can be emitted in an upward direction of the substrate, the opening section in the insulation layer is formed to have a size that enables the laser beam of the higher order mode to be totally reflected at an upper surface of the second distributed Bragg reflection type mirror, at least the second distributed Bragg reflection type mirror defines the columnar section, a side surface of the columnar section is inclined such that the second distributed Bragg reflection type mirror, the insulation layer, the active layer, and at least part of the first distributed Bragg reflection type mirror are continuously conically shaped, and the output of the laser beam of the higher order mode emitted in the downward direction of the substrate is greater than the output of the laser beam of the higher order mode emitted in the upward direction of the substrate.

* * * * *